(12) United States Patent
Iwata

(10) Patent No.: US 10,496,771 B2
(45) Date of Patent: Dec. 3, 2019

(54) SEMICONDUCTOR APPARATUS AND DESIGN APPARATUS

(71) Applicant: Renesas Electronics Corporation, Tokyo (JP)

(72) Inventor: Hiroyuki Iwata, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 417 days.

(21) Appl. No.: 14/964,362

(22) Filed: Dec. 9, 2015

(65) Prior Publication Data

US 2016/0274184 A1 Sep. 22, 2016

(30) Foreign Application Priority Data

Mar. 18, 2015 (JP) ................. 2015-054607

(51) Int. Cl.
G06F 17/50 (2006.01)
G01R 31/3185 (2006.01)

(52) U.S. Cl.
CPC . *G06F 17/5045* (2013.01); *G01R 31/318563* (2013.01); *G01R 31/318566* (2013.01)

(58) Field of Classification Search
CPC ........ G06F 17/5045; G01R 31/318566; G01R 31/318563
USPC ...................................................... 716/103
See application file for complete search history.

(56) References Cited

U.S. PATENT DOCUMENTS 5,257,267 A * 10/1993 Ishizaka ......... G01R 31/318541
714/731
7,197,681 B2 * 3/2007 Dervisoglu .... G01R 31/318335
714/726
7,337,379 B2 2/2008 Hiraide
7,814,444 B2 * 10/2010 Wohl ..................... G06F 17/505
716/100
7,823,034 B2 * 10/2010 Wohl ............. G01R 31/318547
714/726

(Continued)

FOREIGN PATENT DOCUMENTS

JP  H 3-252569 A  11/1991
JP  2004-12420 A  1/2004

(Continued)

OTHER PUBLICATIONS

Japanese Office Action dated Sep. 18, 2018 in Japanese Application No. 2015-054607 with an English translation thereof.

(Continued)

*Primary Examiner* — Jack Chiang
*Assistant Examiner* — Brandon Bowers
(74) *Attorney, Agent, or Firm* — McGinn I.P. Law Group, PLLC.

(57) ABSTRACT

In a compression scan, the number of test steps is reduced without reducing a defection efficiency. A semiconductor apparatus includes one or more scan chains each including one or more MMSFFs being serially connected and combinational circuits and can switch between a scan shift operation and a capture operation. The MMSFF includes an MUX that selects one of an external input test signal which is externally input and a shift test signal which is input via the MMSFF in a preceding stage in the same scan chain, and an FF that outputs one of the external input test signal and the shift test signal which has been selected by the MUX.

7 Claims, 17 Drawing Sheets

(56) References Cited

U.S. PATENT DOCUMENTS

2008/0256497 A1 10/2008 Wohl et al.
2011/0307748 A1 12/2011 Laisne
2013/0205180 A1* 8/2013 Sato ............... G01R 31/318547
714/727

FOREIGN PATENT DOCUMENTS

JP 2004-077356 A 3/2004
JP 2012-198078 A 10/2012

OTHER PUBLICATIONS

Japanese Office Action dated Jan. 29, 2019 with an English translation in Japanese Application No. 2015-054607 with an English translation thereof.
Chinese Office Action dated Aug. 1, 2019 with an English translation in Chinese Application No. 201610045085.4 with an English translation thereof.

* cited by examiner

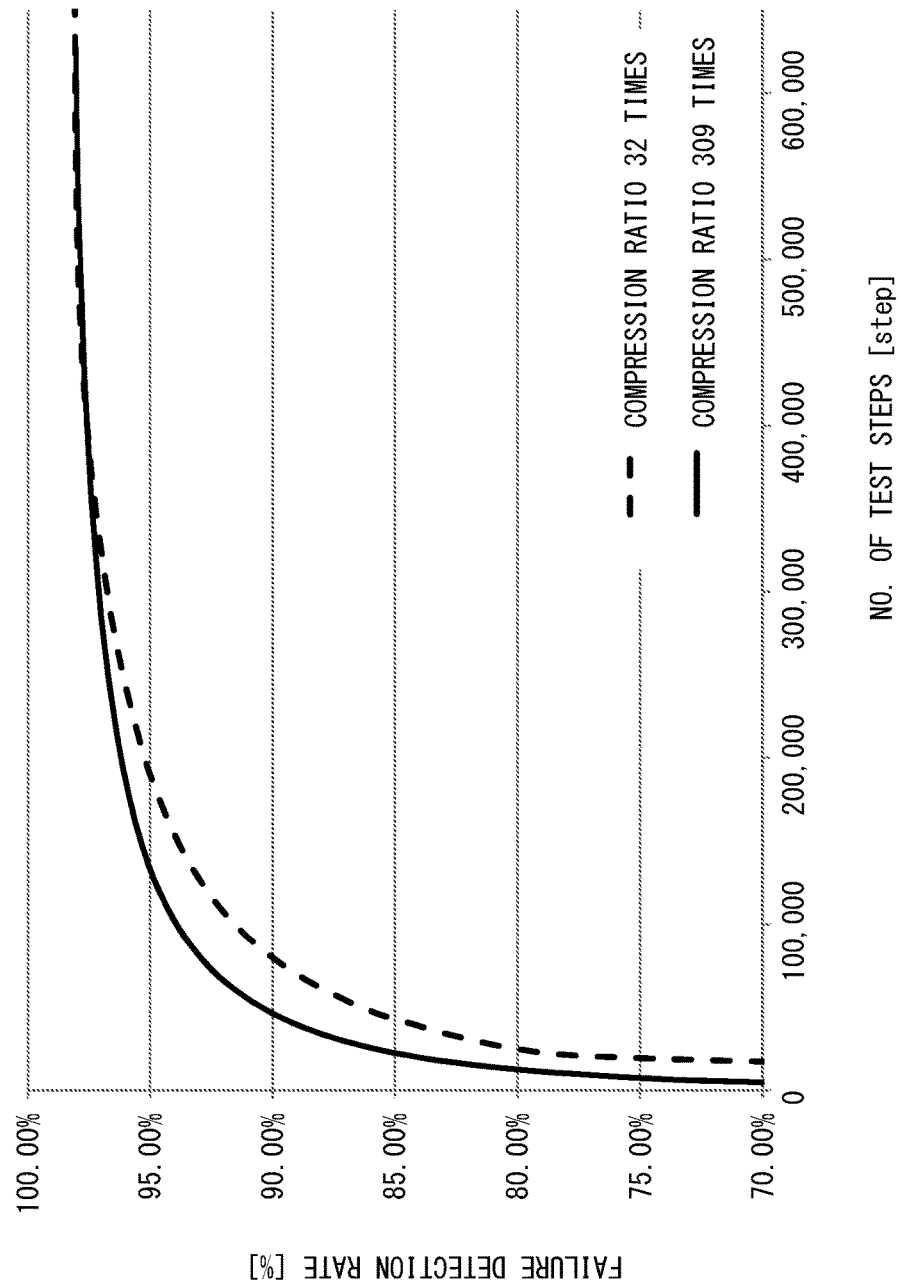

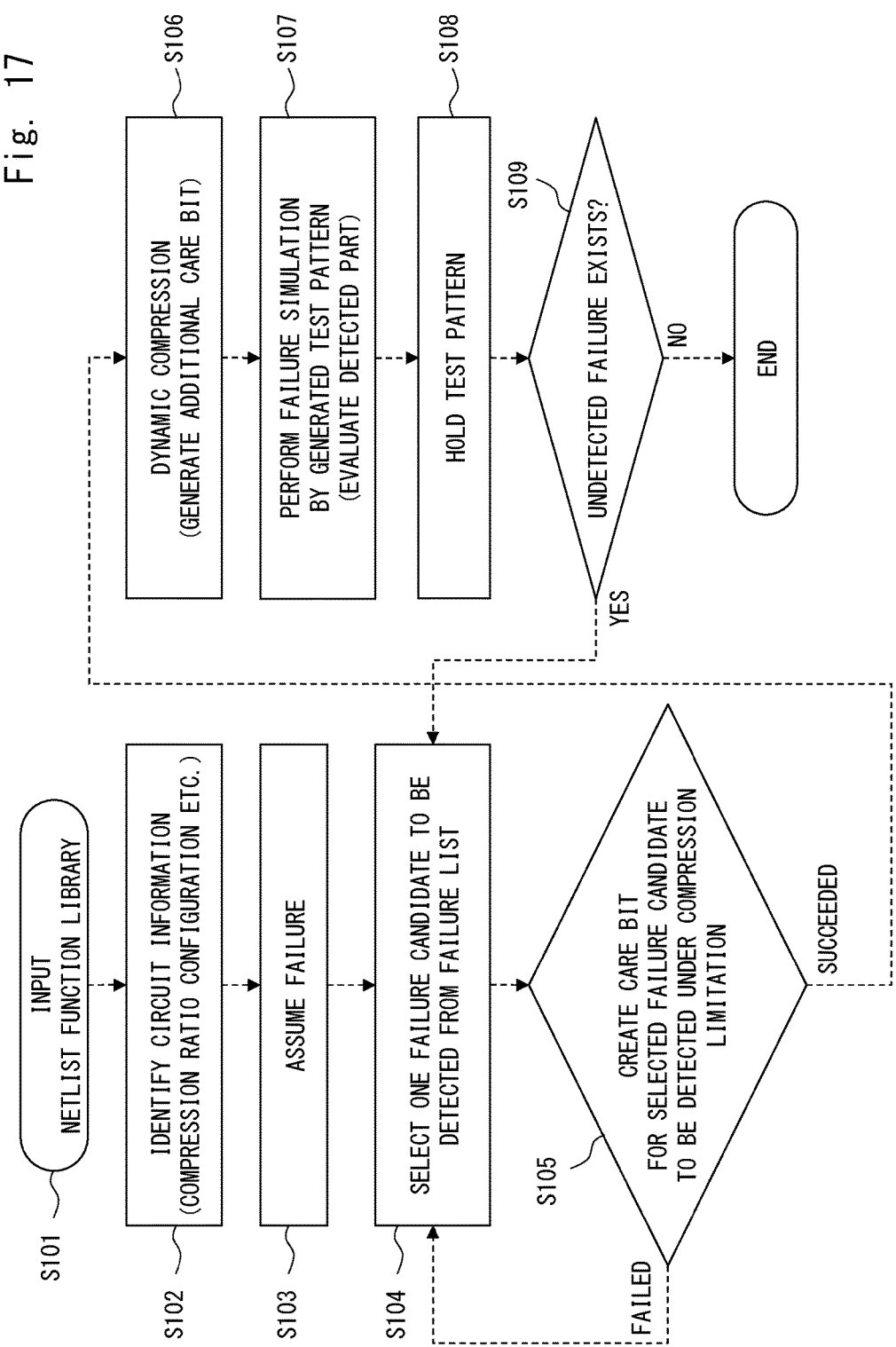

SEMICONDUCTOR APPARATUS AND DESIGN APPARATUS

CROSS-REFERENCE TO RELATED APPLICATIONS

This application is based upon and claims the benefit of priority from Japanese patent application No. 2015-054607, filed on Mar. 18, 2015, the disclosure of which is incorporated herein in its entirety by reference.

BACKGROUND

The present invention relates to a semiconductor apparatus and a design apparatus and to, for example, a semiconductor apparatus capable of performing a variable compression scan test and a design apparatus for the semiconductor apparatus.

A common method of testing LSI (Large Scale Integration) is a scan test. In the scan test, a flip-flop (FF) in a circuit is replaced by an FF having a multiplexer (MUX) which is referred to as a scan FF. The MUX switches between a test input and normal operation input by a scan enable signal.

At the time of the scan test, scan FFs are serially connected to each other so that the scan FFs operate as a shift register (this is referred to as a "scan chain") that can be controlled by an external input/output terminal of the LSI. By shifting the scan chain in response to a scan enable signal (this operation shall be referred to as a "scan shift operation"), an arbitrary test pattern is set in each scan FF.

Then, when the scan enable signal is switched, a value from the normal operation input is captured in the scan FF (this operation shall be referred to as a "capture operation"). The value captured in the capture operation is shifted again by the scan FF, and a response is observed (unload). At the same time as this unloading, the next test pattern is applied (load). The scan test is executed in this way.

In the scan test, as the number of necessary shift cycles corresponds to the number of the scan FFs that are connected to the scan chain, an extremely large number of test steps is required. A circuit having a large number of stages of the scan chain requires a long time for conducting the scan test, thus greatly influencing a cost of the test.

Japanese Unexamined Patent Application Publication No. 2004-77356 (Sannomiya) discloses a method of establishing a scan chain that reduces the number of test patterns for causing the scan chain to perform a shift operation. In the scan chain disclosed by Sannomiya, selectors for bypasses are inserted between a plurality of scan FFs. In this method of establishing a scan chain, the number of test patterns necessary for testing combinational circuits that are connected respectively to the plurality of scan FFs is calculated, and the plurality of scan FFs are grouped so as to correspond to the number of test patterns. When the scan FFs that are connected to the combinational circuits in which the test has been ended are bypassed by the unit of the groups, the shift operation is skipped and the number of test patterns is reduced.

SUMMARY

Another method of reducing a time for conducting the scan test is a compression scan. In the compression scan, more scan chains than the number of external terminals are internally established so as to reduce the number of stages of scan FFs in one scan chain. Then, a value supplied by the external terminal is deployed to each internal scan chain via an expander, and a test pattern is loaded to each scan FF. Further, an output from the scan chain is compressed by a compression circuit and observed by an external output channel.

In the compression scan, the number of shift cycles for setting a setting value (a care bit) of the scan FF necessary for detecting a failure can be less than that of the case in which the expander and the compression circuit are not used. Moreover, all scan FFs can be observed by a small number of shift cycles, and thus the number of failure detections in one bit (one cycle) of an external input/output terminal can be increased, and the number of test steps can be reduced. A ratio between the number of external input/output terminals and the number of scan chains in the compression scan shall be referred to as a compression ratio.

As the compression ratio cannot be changed in the conventional compression scan, it is necessary for a user to think of an appropriate compression ratio by which the number of test patterns will become small. When the compression ratio is made too high, a care bit necessary for detecting a failure cannot be set, thereby reducing a failure detection rate and a detection efficiency in each test pattern.

The care bit that is necessary for detecting a failure in a particular scan FF is determined by a combination of a value of the particular scan FF and a value of another scan FF. In the technique disclosed by Sannomiya, a configuration of the scan chain is changed according to the number of test patterns necessary for testing a plurality of combinational circuits. In order to effectively reduce the number of stages of the scan chain, the configuration of the scan chain needs to be changed for each pattern according to the care bit. As a result of this, there will be too many configurations which cannot be achieved due to an issue of a practical area overhead.

Additionally, the care bit that can be set in the compression scan changes according to the configuration of the scan chain. The present inventor has found a problem that the technique disclosed by Sannomiya does not consider the compression scan and cannot reduce the number of stages of the scan chain in the case of the compression scan.

Other problems of the related art and new features of the present invention will become apparent from the following descriptions of the specification and attached drawings.

An aspect of the present invention is a scan flip-flop that includes a logical structure capable of selecting and outputting one of an external input test signal that is externally input and a shift test signal that is input via a scan flip-flop in a preceding stage in the same scan chain in a scan shift operation.

Note that a design apparatus and a design method for the semiconductor apparatus according to the above aspect, and a program for causing a computer to execute some of processes of the design method are also effective as aspects of the present invention.

According to the above aspect, by changing a compression ratio for each test pattern, the number of test steps can be reduced without lowering a detection efficiency.

BRIEF DESCRIPTION OF THE DRAWINGS

The above and other aspects, advantages and features will be more apparent from the following description of certain embodiments taken in conjunction with the accompanying drawings, in which:

FIG. 16 is a graph showing a relationship between the number of test steps and a failure detection rate with different compression ratios in the semiconductor apparatus according to the comparative example; and FIG. 17 is a drawing showing a design flow of the semiconductor apparatus according to the comparative example.

DETAILED DESCRIPTION

Figure 1:
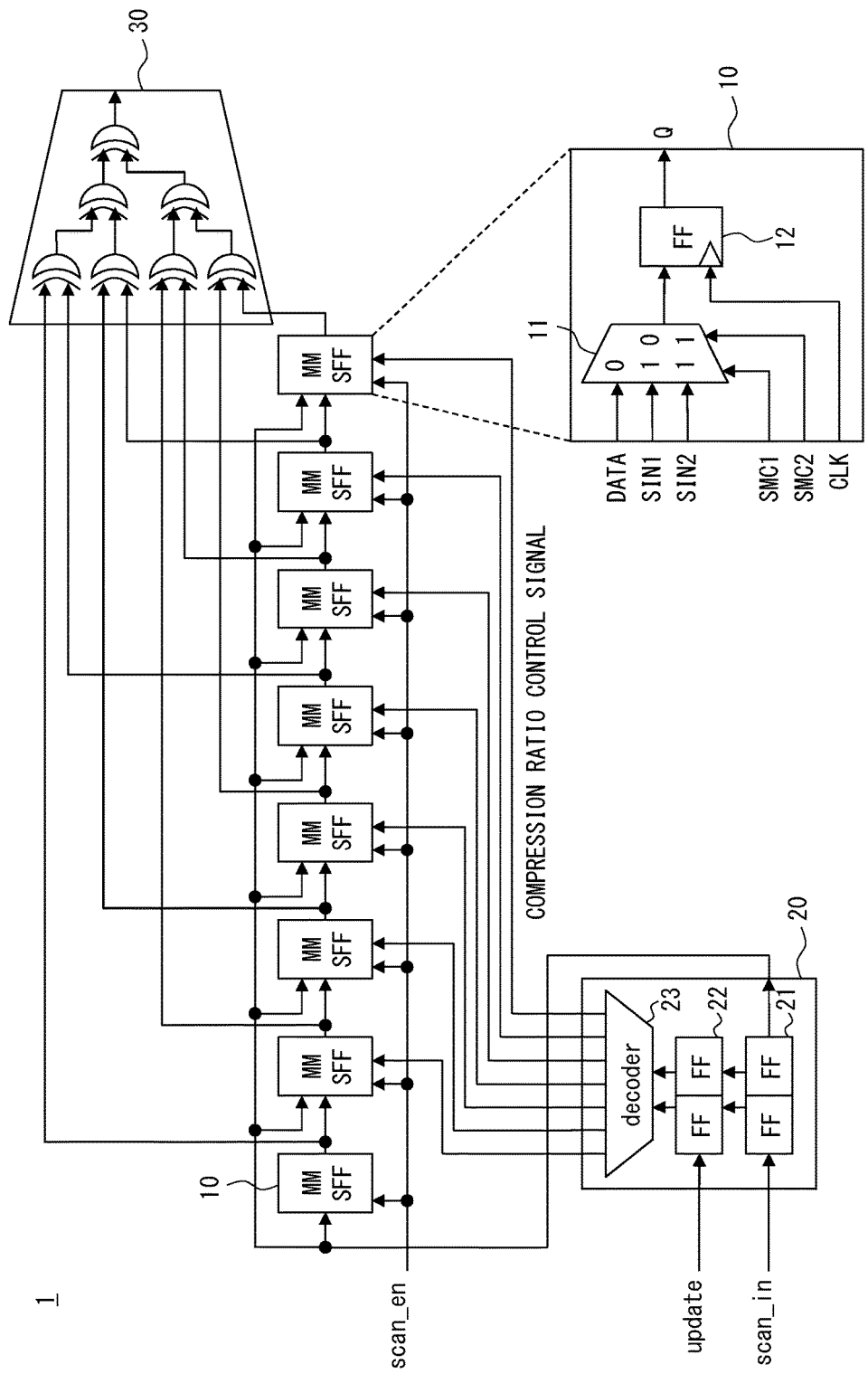
FIG. 1 is a drawing showing a configuration of a semiconductor apparatus according to a first embodiment.

Hereinafter, embodiments shall be explained with reference to the drawings. To clarify the explanation, some parts thereof and some of the drawings have been omitted or simplified as appropriate. Further, the elements illustrated in the drawings as functional blocks for performing various processes can be implemented hardware-wise by a CPU, a memory, and other circuits, and software-wise by a program loaded onto a memory or the like. Accordingly, it is to be understood by those skilled in the art that these functional blocks can be implemented in various forms including, but not limited to, being implemented by hardware alone, software alone, or a combination of hardware and software. Specific values or the like shown in the following embodiments are merely illustrative for easier understanding of the invention and not limited to the specific values or the like unless otherwise particularly specified. Note that in the drawings, the same elements are denoted by the same reference numerals, and repeated descriptions are omitted as needed.

The embodiments relate to a semiconductor apparatus capable of performing a compression scan test and a design apparatus for the semiconductor apparatus. The semiconductor apparatus according to the embodiments has a logical structure that is capable of performing a scan test while switching, for each test pattern, a compression ratio which is a ratio between the number of external input/output terminals and the number of scan chains. A logical circuit capable of switching the number of scan chains includes scan flip-flops (SFFs) that constitute each scan chain. The SFF has a configuration that is capable of selecting one of an external input test signal that is externally input and a shift test signal that is shifted in the scan chain and outputting the selected signal. By changing a path of the scan chain according to a control signal, the number of scan chains can be switched.

Hereinafter, a scan test capable of changing the compression ratio shall be referred to as a variable compression scan test. The embodiments can be applied to a semiconductor apparatus such as an MCU (Micro Controller Unit), SoC (System-on-a-chip) or the like which is necessary for reducing a scan test time. Further, the design apparatus according to the embodiments is used as an EDA (electronic design automation) tool for designing a semiconductor apparatus that enables the variable compression scan test.

First Embodiment

A semiconductor apparatus according to a first embodiment shall be explained as follows with reference to FIG. 1. FIG. 1 is a drawing showing a configuration of a semiconductor apparatus 1 according to the first embodiment. As shown in FIG. 1, the semiconductor apparatus 1 includes a plurality of MMSFFs (Multimode supported Scan Flip-Flops) 10, a multimode control circuit 20, and a compressor 30. In this example, scan chain configurations having different numbers of scan chains shall be respectively referred to as modes, and a plurality of modes shall be referred to as a multimode. The multimode supporting scan flip-flop is a flip-flop that can have a plurality of scan chain configurations with different compression ratios for a compression scan test by selecting and outputting an external input test signal or a shift test signal.

In the semiconductor apparatus 1, one or more MMSFFs 10 are serially connected to thereby establish one or more scan chains. An expander is connected to input sides of the plurality of scan chains. The expander expands and converts the external input test signal according to the number of scan chains. Note that FIG. 1 shows an example in which an expander having a fan-out configuration is used, the expander itself not being shown. An expander using a linear feedback shift register (LFSR) or a phase shifter may be used.

In the example shown in FIG. 1, eight MMSFFs 10 are serially connected. Outputs of the MMSFFs 10 are connected to a compressor 30. The compressor 30 compresses and converts outputs from the plurality of scan chains. The compressor 30 is comprised of an XOR (exclusive OR) tree. The compressor 30 compresses the outputs from the MMSFFs 10 into one output. The minimum number of scan chains corresponds to the number of external input/output terminal pairs. In the example of FIG. 1, the minimum number of scan chains is one, while the maximum number of scan chains is eight.

The MMSFFs 10 can switch between a scan shift operation for causing the MMSFFs 10 inside the scan chain to operate as a shift register and a capture operation for capturing an output from a combinational circuit. In the scan shift operation, a value is set in each MMSFF 10. In the capture operation, the value set in each MMSFF 10 in the shift operation is supplied to the combinational circuit, and a result of a logic calculation in the combinational circuit is captured. The values transferred in the scan shift operation and the capture operation shall be referred to as a test pattern.

The MMSFF 10 includes an MUX (a multiplexer) 11, an FF (flip-flop) 12, a data terminal DATA, a first scan-in terminal SIN1, a second scan-in terminal SIN2, a first control input terminal SMC1, a second control input terminal SMC2, and a clock terminal CLK. The MUX 11 switches between the scan shift operation and the capture operation according to a scan enable signal (scan-en) that is input from the first control input terminal SMC1. That is, the scan enable signal (scan-en) is a switching signal for switching between the scan shift operation and the capture operation.

Further, the MUX 11 selects, in the scan shift operation, the external input test signal that is input from the expander or the shift test signal that is input from a scan flip-flop in the preceding stage in the same scan chain. The external input test signal is an externally input setting value for the MMSFF 10 in order to perform a compression scan test. The shift test signal is the external input test signal being shifted between the MMSFFs 10. The MMSFF 10 includes scan-in terminals of two systems which are the first scan-in terminal SIN1 and the second scan-in terminal SIN2. The external input test signal is input to the MUX 11 from the first scan-in terminal SIN1, and the shift test signal is input to the MUX 11 from the second scan-in terminal SIN2.

The MMSFF 10 includes control input terminals of two systems which are the first control input terminal SMC1 and the second control input terminal SMC2 for controlling the selection on the external input test signal or the shift test signal. A compression ratio control signal for switching the outputs from the MMSFFs 10 is input from the second control input terminal SMC2. The MUX 11 selects the external input test signal or the shift test signal according to the compression ratio control signal. That is, the compression ratio control signal is a selection signal for selecting one of the external input test signal and the shift test signal. The FF 12 holds the external input test signal or the shift test signal that has been selected by the MUX 11 and outputs the holding signal according to a test clock signal that is input from the clock terminal CLK.

In other words, the MMSFF 10 can be selectively connected to the expander or the MMSFF 10 in the preceding stage in the scan chain. More specifically, the MMSFF 10 can switch between a first state in which the MMSFF 10 is connected to the expander and a second state in which the MMSFF 10 is connected to the MMSFF 10 in the preceding stage in the same scan chain. The compression ratio control signals are supplied to the MMSFFs 10 from the multimode control circuit 20 for each test pattern. The MMSFF 10 switches a connection destination between the expander and the MMSFF 10 in the preceding stage according to the test pattern.

The data terminal DATA is enabled, for example, when the scan enable signal that is input from the first control input terminal SMC1 is low (0), while the first scan-in terminal SIN1/the second scan-in terminal SIN2 are enabled when the scan enable signal is high (1). Further, a path of the first scan-in terminal SIN1 is enabled when the compression ratio control signal that is input from the second control input terminal SMC2 is low (0), while a path of the second scan-in terminal SIN2 is enabled when the compression ratio control signal is high (1). The first scan-in terminal SIN1 of each MMSFF 10 is connected to the expander, and the output of the MMSFF 10 in the preceding stage in the same scan chain is connected to the second scan-in terminal SIN2.

The multimode control circuit 20 controls the MUX 11 to select the external input test signal or the shift test signal according to the test pattern which is set in the MMSFF 10. The multimode control circuit 20 includes a shift register 21, a hold register 22, and a decoder 23. A scan-in signal (scan_in) including the external input test signal and the compression ratio control signal is externally input to the shift register 21.

In the example shown in FIG. 1, the shift register 21 is connected in series to the plurality of MMSFFs 10. In a scan test operation period, the external input test signal is transferred inside the shift register 21 and input to the MMSFFs 10 via the expander not shown. Note that the multimode control circuit 20 is not necessarily connected in series to each MMSFF 10, and dedicated input terminals may be provided for the multimode control circuit 20 so as to independently control each scan chain.

The compression ratio control signal is set in the shift register 21 in the scan shift operation and captured in the hold register 22 by an update signal. The hold register 22 remains unchanged during the scan shift operation period. In response to the update signal, the compression ratio control signal captured in the hold register 22 is decoded by the decoder 23 and supplied to the second control input terminal SMC2 of each MMSFF 10.

Figure 2:
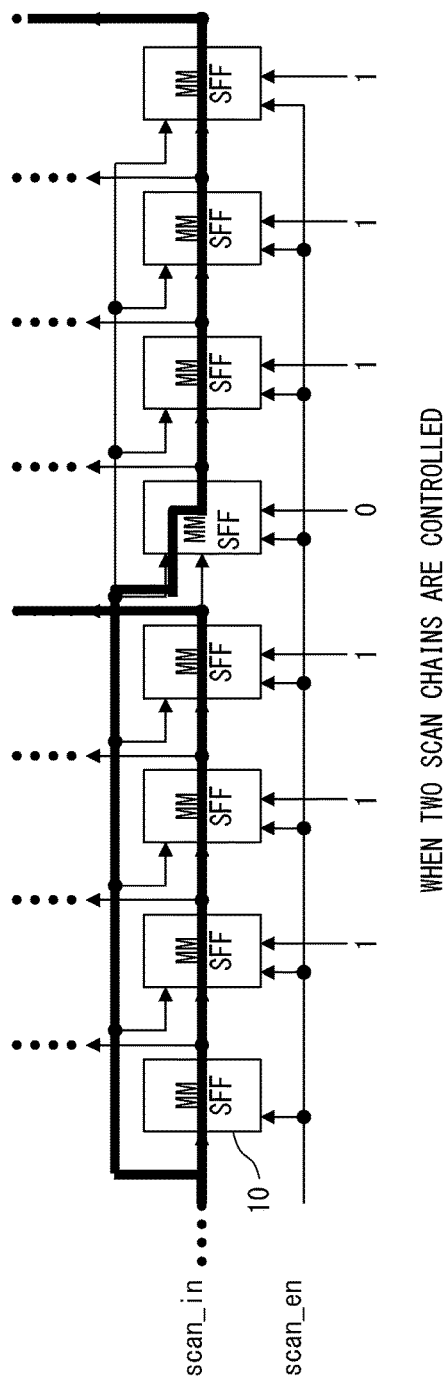
FIG. 2 is a drawing showing an example of a control by the semiconductor apparatus according to the first embodiment.
Figure 3:
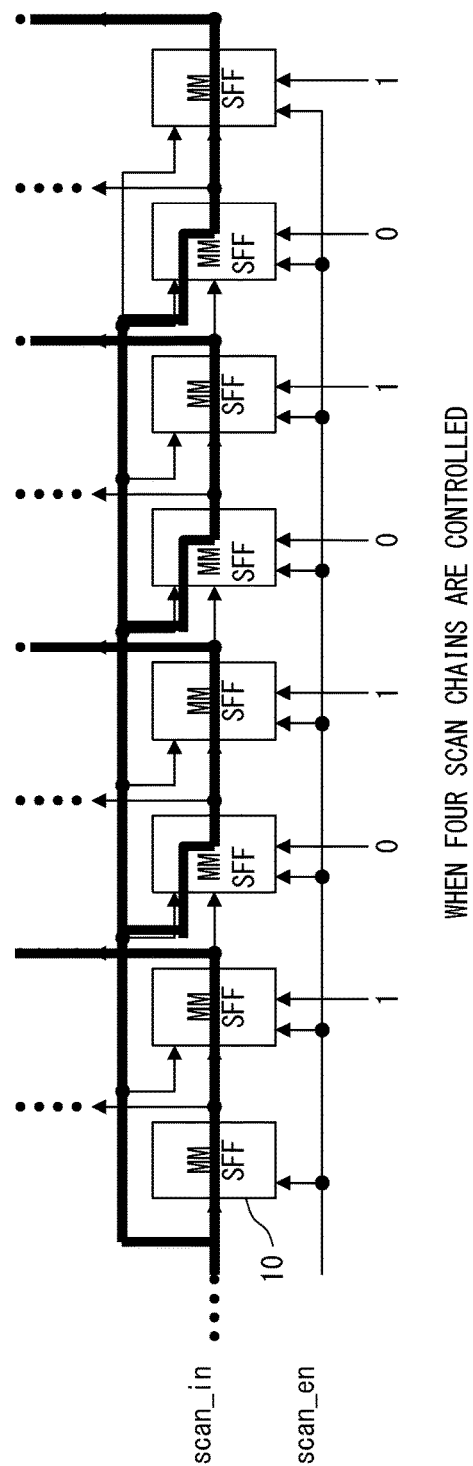
FIG. 3 is a drawing showing another example of the control by the semiconductor apparatus according to the first embodiment.

An example of a control on the semiconductor apparatus according to the first embodiment shall be explained as follows with reference to FIGS. 2 and 3. FIG. 2 shows a mode in which there are two scan chains, and FIG. 3 shows a mode in which there are four scan chains. In the example shown in FIG. 2, a value of seven bits which is "1110111" is set in order from the second MMSFF 10 as the compression ratio control signal. In this case, two scan chains in which one starts with the first MMSFF 10 and another one starts with the fifth MMSFF 10 are established. Each scan chain is comprised of four stages of the MMSFFs 10. The external input test signal is input to the first MMSFF 10 and the fifth MMSFF 10, and the shift test signal from the MMSFFs 10 in the preceding stages is input to other MMSFFs 10.

In the example shown in FIG. 3, a value of seven bits which is "1010101" is set in order from the second MMSFF 10 as the compression ratio control signal. In this case, four scan chains in which one starts with the first MMSFF 10, another one starts with the third MMSFF 10, still another one starts with the fifth MMSFF 10, and one more starts with the seventh MMSFF 10 are established. Each scan chain is comprised of two stages of the MMSFFs 10. The external input test signal is input to the first, third, fifth, and seventh MMSFFs 10, and the shift test signal from the MMSFFs 10 in the preceding stage is input to other MMSFFs 10. In a manner similar to the above case, to set a mode in which there is one scan chain comprised of eight stages, the compression ratio control signal having a value of "1111111" is input, and to set a mode in which eight scan chains each comprised of one stage, a compression ratio control signal having a value of "0000000" is input.

The number of multimodes that can be configured depends on the number of combinations of control signals that can be output from the multimode control circuit 20. When the hold register 22 is, for example, two bits, there are four ways of the multimode that can be selected from.

Figure 4:
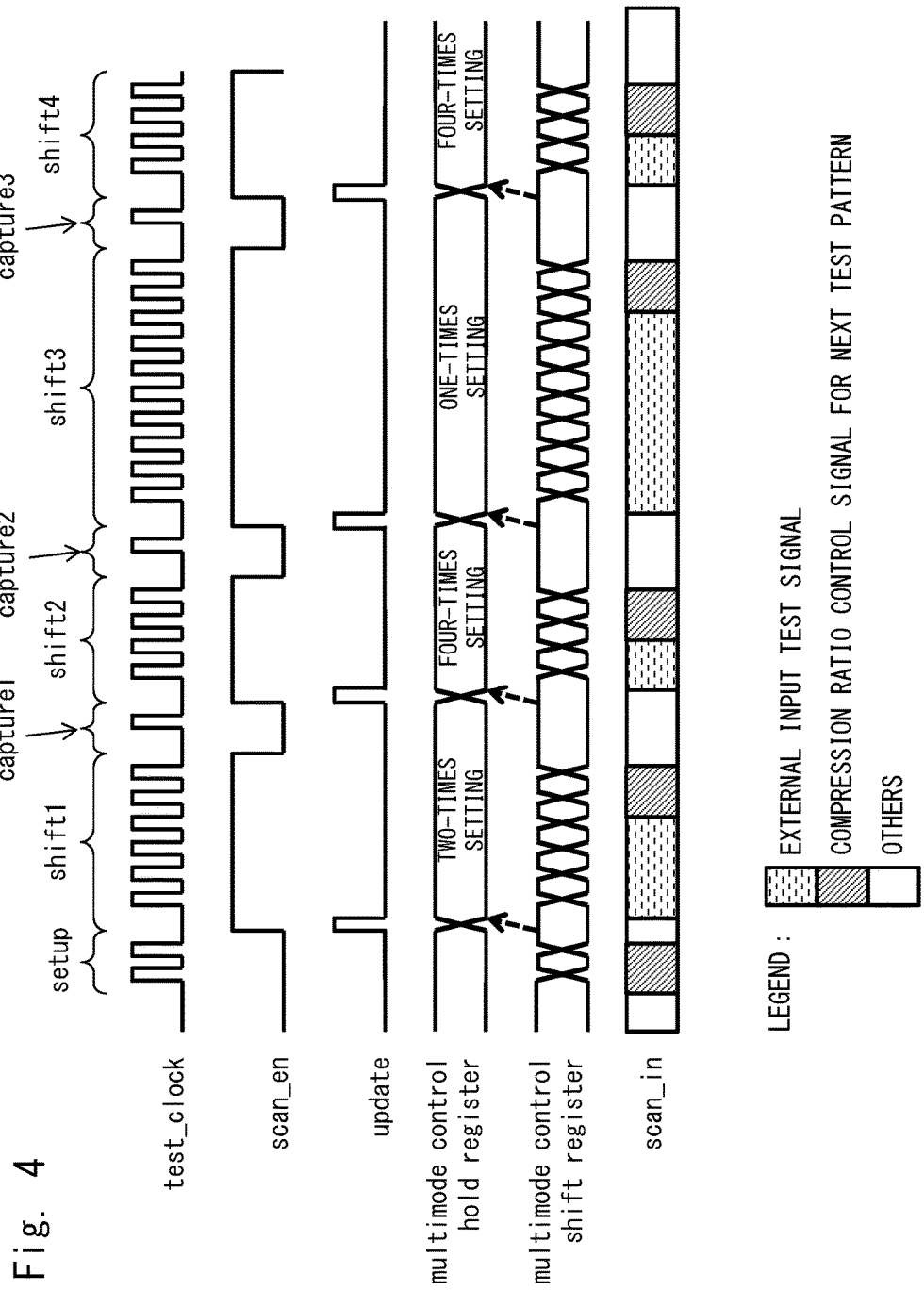
FIG. 4 is a drawing for explaining an operation of the semiconductor apparatus according to the first embodiment.

An operation of the semiconductor apparatus 1 shall be explained as follows with reference to FIG. 4. FIG. 4 is a drawing for explaining the operation of the semiconductor apparatus according to the first embodiment. In FIG. 4, "test_clock" indicates a test clock signal, "scan_en" indicates a scan enable signal, "update" indicates an update signal, and "scan_in" indicates a scan-in signal. As described above, the scan-in signal includes the external input test signal and the compression ratio control signal. An output signal from the hold register 22 is referred to as a "multimode control hold register", and an output signal from the shift register 21 is referred to as a "multimode control shift register". Further, shift1 to shift4 indicate scan shift periods for performing the scan shift operation, capture1 to capture3 indicate capture periods for performing the capture operation. Moreover, setup indicates a setup period for firstly establishing a scan chain.

In the circuit configuration shown in FIG. 1, as the shift register 21 of the multimode control circuit 20 and the scan chain are connected in series, the compression ratio control signal for the next test pattern is input after the external input test signal as the scan-in signal is input. The external input test signal is loaded to each MMSFF 10 in the scan shift operation.

Firstly, in the setup period, the compression ratio control signal for a test pattern which will be input in the scan shift period shift1 following the setup period is input. This compression ratio control signal is set in the shift register 21 and captured in the hold register 22 in response to the update signal. The compression ratio control signal that has been captured in the hold register 22 is output to the second control input terminal SMC2. The MMSFF 10 changes the path of the scan chain according to the compression ratio control signal that has been input from the second control input terminal SMC2.

As has been explained above, when the value of the compression ratio control signal is one, an output from the MMSFF 10 in the preceding stage in the same scan chain is selected, while when the value of the compression ratio control signal is zero, an output from the expander is selected. That is, the MMSFF 10 to which the compression ratio control signal having the value of zero is input is a starting point of the scan chain. In the example shown in FIG. 4, a multimode setting for the test pattern in the scan shift period shift1 is a two-times setting. In the setup period, the compression ratio control signal for establishing two scan chains are set in the shift register 21.

Then, the compression ratio control signal that has been set in the shift register 21 is captured in the hold register 22 in response to the update signal. This compression ratio control signal is held during the scan shift period shift1. In the scan shift period shift1, as shown in FIG. 2, a mode in which two scan chains each having four stages are established is set.

After that, at a rising edge of the scan enable signal, the scan shift operation is performed in the mode in which two scan chains are established. The scan-in signal that is input in the scan shift period shift1 includes the external input test signal corresponding to the test pattern that is set in each MMSFF 10 in the scan shift period shift1 and the compression ratio control signal for a test pattern that will be set in the MMSFFs 10 in the next scan shift period shift1. In the scan shift period shift1, firstly the external input test signal is input, and then the compression ratio control signal for the next test pattern is input.

The external input test signal is expanded by the expander and deployed to each scan chain. Then, the scan shift operation is executed for the number of scan shifts corresponding to the number of scan chains, and the test pattern is set in each MMSFF 10. After the external input test signal is input, the compression ratio control signal for the next test pattern is input. In the example shown in FIG. 4, the multimode setting for the test pattern in the next scan shift period shift2 is a four-times setting. The compression ratio control signal in which four scan chains are established is set in the shift register 21 in the scan shift period shift1.

Then, at a falling edge of the scan enable signal, the capture operation is performed. In the capture period, a normal operation signal is input from the data terminal DATA, and the test pattern that has been set in the MMSFFs 10 is supplied to a combinational circuit not shown. A result of a logical calculation by the combinational circuit is captured in the MMSFFs 10. The value captured in the capture operation is shifted again by the scan FF, and a response is observed.

After that, the compression ratio control signal that has been set in the shift register 21 is captured in the hold register 22 in response to the update signal. This compression ratio control signal is held during the scan shift period shift2. In the scan shift period shift2, as shown in FIG. 3, a mode in which four scan chains each having two stages are established is set. In this manner, in the previous scan shift period shift1, the compression ratio control signal for the test pattern which will be set in the next scan shift period shift2 is input to the shift register 21. Then, in the scan shift period shift2, at a rising edge of the scan enable signal, the scan shift operation is performed in the mode in which the four scan chains are established.

Similarly, in the scan shift period shift2, the compression ratio control signal for the test pattern which will be set in the next scan shift period shift3 is input. In the example shown in FIG. 4, the multimode setting for the test pattern in the next scan shift period shift3 is a one-time setting. In the scan shift period shift2, the compression ratio control signal for establishing one scan chain is input. Thus, in the scan shift period shift3, a mode in which one scan chain is established is set.

As described above, in the semiconductor apparatus 1 of the first embodiment, the number and stages of the scan chains in the compression scan test can be arbitrarily changed by the compression ratio control signal that is supplied from the multimode control circuit 20 at the time of the scan test. That is, the multimode control circuit 20 updates the path of the scan chain for each test pattern and performs the scan test. By doing so, the number of scan shifts can be changed.

Figure 15:
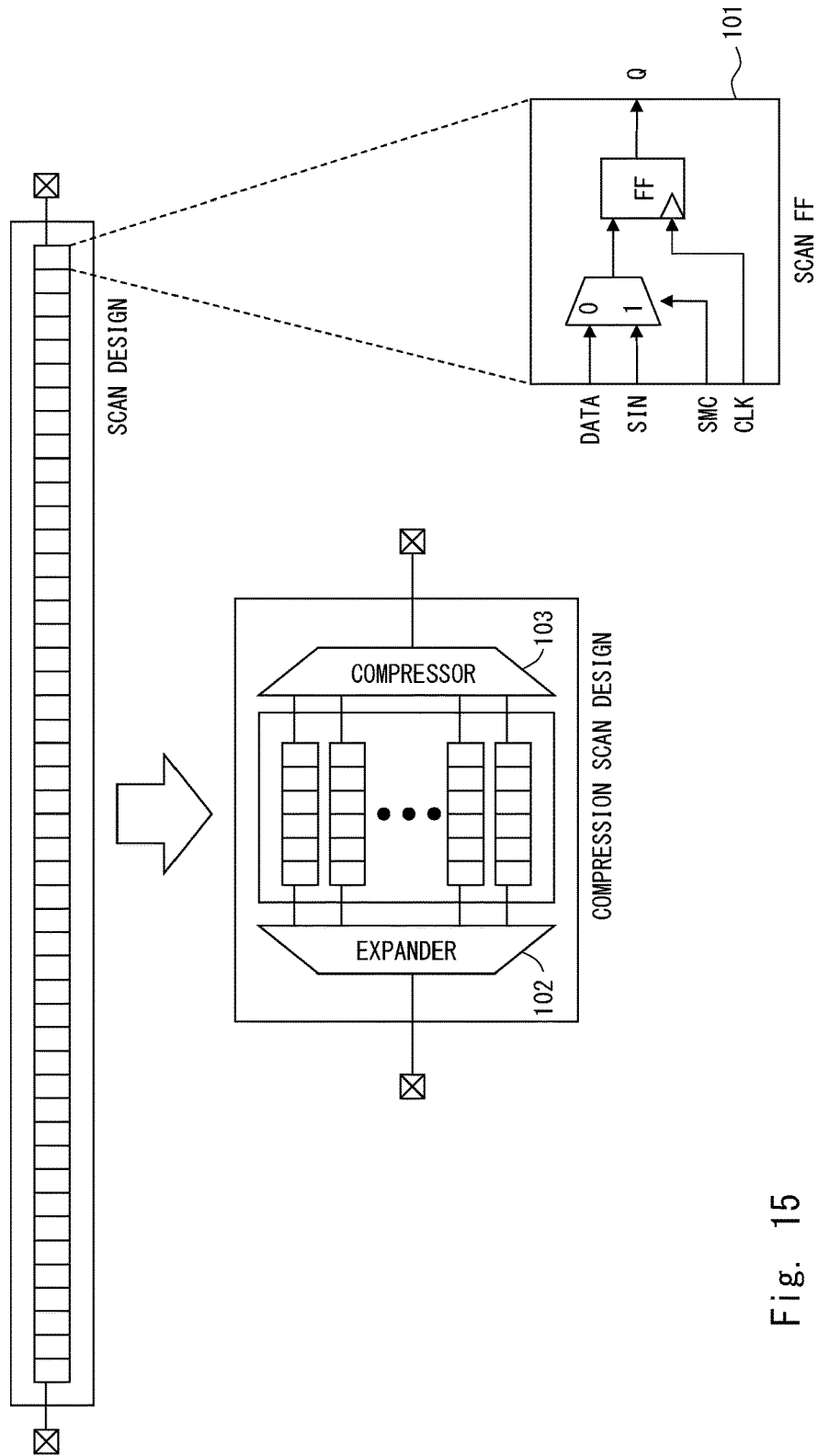
FIG. 15 is a drawing showing a configuration of a semiconductor apparatus according to a comparative example.

A semiconductor apparatus according to a comparative example shall be explained as follows. FIG. 15 is a drawing showing a configuration of the semiconductor apparatus according to the comparative example. As shown in FIG. 15, the semiconductor apparatus according to the comparative example includes a scan FF 101 that is capable of only switching between the scan shift operation and the capture operation. In a compression scan design using such a scan FF 101, more scan chains than the number of external terminals are established, thereby reducing the number of stages of the scan FFs 101 in one scan chain. An expander 102 is connected to an input side of the scan chain, and a compressor 103 is connected to an output side of the scan chain.

In a compression scan test of the comparative example, as the compression ratio cannot be changed, a user needs to think of an optimal compression ratio by which the number of test steps will become small. When the compression ratio is made too high, a care bit necessary for detecting a failure cannot be set, thereby reducing a failure detection rate and a detection efficiency in each test pattern. A collection of test patterns with a high failure detection rate and with a small number of test steps is considered possible to achieve by increasing the number of failures that can be detected at the same time per bit (per cycle) of each input/output terminal of each cycle.

In a conventional compression scan of the comparative example, the compression ratio is always fixed, thus the number of shift cycles is constant. In the scan shift cycle, there may be a cycle that does not contribute to detecting a failure. FIG. 16 shows a relationship between the number of test steps and a failure detection rate with different compression ratios in the semiconductor apparatus according to the comparative example. FIG. 16 shows a result in a high-compressed scan design (the compression ratio is 309 times) and a low-compressed scan design (the compression ratio is 32 times) with respect to a certain test circuit. Note that a test time is proportional to the number of test steps.

As shown in FIG. 16, a slope of the failure detection rate of the high-compressed scan design is greater than that of the low-compressed scan design until the failure detection rate becomes about 94%. From when the failure detection rate becomes about 94% and onward, the slope of the failure detection rate of the low-compressed scan design is greater than that of the high-compressed scan design. From this graph, it can be seen that when the high-compressed scan design and the low-compressed scan design are switched according to the test pattern in such a way that a rate of an increase in the failure detection rate will become large, the number of the test steps may be reduced. In the example of FIG. 16, when the high-compressed scan design is simply switched to the low-compressed scan design, for example, when the failure detection rate becomes near 94%, a reduction of about 10% in the number of test steps can be expected.

As described above, the semiconductor apparatus according to the first embodiment can execute the compression scan test at an arbitrary compression ratio for each test pattern. This enables a flexible switching of the configuration between the high-compressed scan design and the low-compressed scan design, and an optimal compression ratio for detecting a failure can be set. It is therefore possible to further reduce the number of test steps and execute the compression scan test more efficiently than in the related art. For example, when the high-compressed scan design is employed to detect a failure that can be easily detected, the number of test steps can be greatly reduced.

Note that an area of the MMSFF 10 is greater than that of the scan FF 101 by about 10%. When a ratio of an area of a logical part in a chip of the scan FF 101 to an area of the whole chip is about 10%, and all the scan FFs 101 are replaced by the MMSFFs 10, the area of the logical part of the chip increases by about 1%. Therefore, an influence of using the MMSFFs 10 on the area of the chip is small. As has been explained above, the first embodiment can achieve, in a small area, a logical structure that is capable of switching a plurality of scan chain configurations by the combination of the MMSFFs 10 and the multimode control circuit 20.

Second Embodiment

Figure 5:
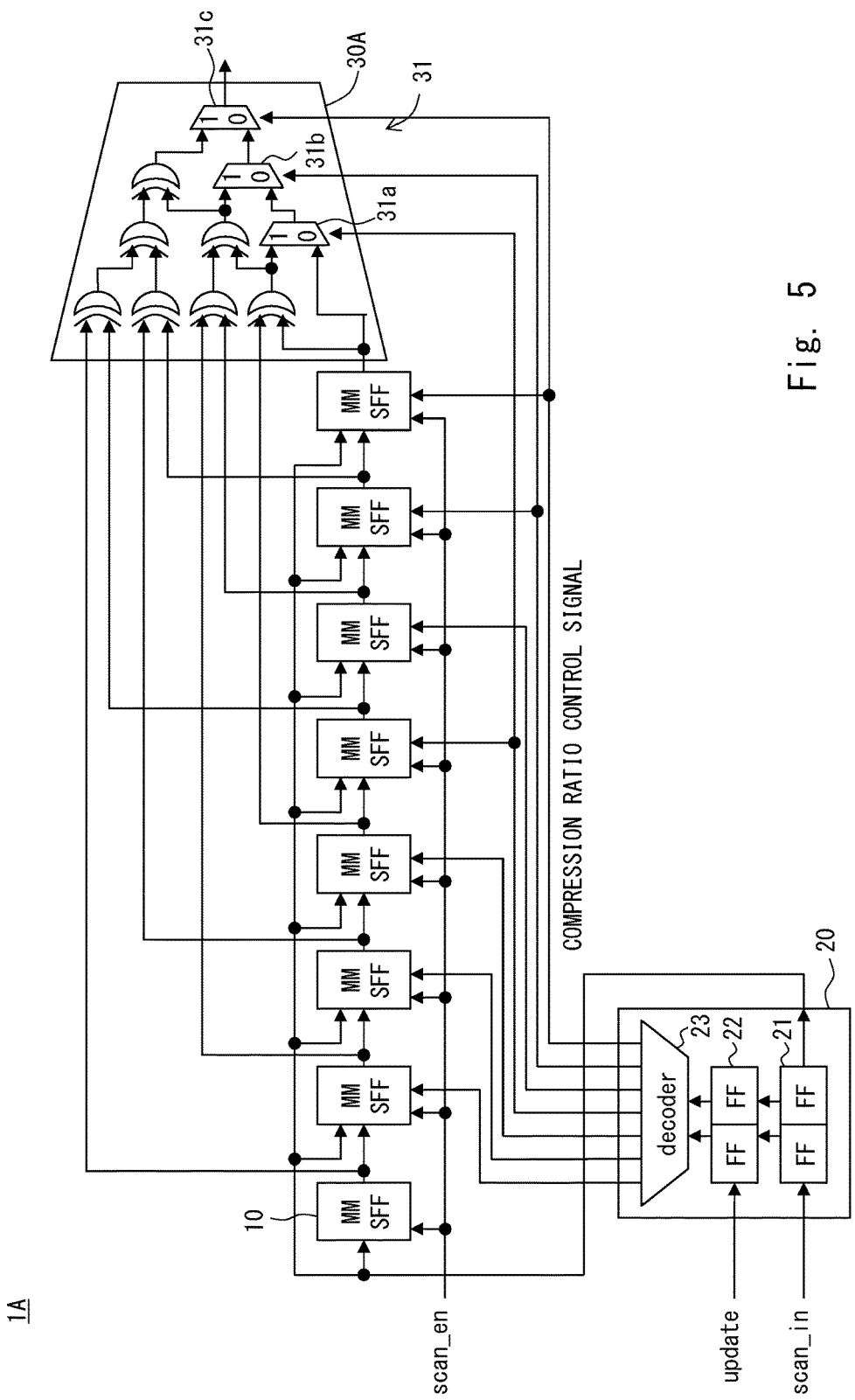
FIG. 5 is a drawing showing a configuration of a semiconductor apparatus according to a second embodiment.

A semiconductor apparatus according to a second embodiment shall be explained as follows with reference to FIG. 5. FIG. 5 is a drawing showing a configuration of a semiconductor apparatus 1A according to the second embodiment. As shown in FIG. 5, the semiconductor apparatus 1A includes a plurality of the MMSFFs 10, the multimode control circuit 20, and a compression ratio variable compressor 30A. A difference between the first embodiment and the second embodiment is that in the second embodiment, the variable compressor 30A is included in place of the compressor 30 that is included in the first embodiment.

The variable compressor 30A can change the compression ratio according to the number of scan chains. The variable compressor 30A includes an XOR (exclusive OR) tree and MUXs (multiplexers) 31 (31a to 31c). An output from each MMSFF 10 is input to XOR gates that constitute the XOR tree. For example, as shown in FIG. 5, outputs from the first and fifth MMSFFs 10 are input to the first XOR gate, outputs from the third and seventh MMSFFs 10 are input to the second XOR gate, outputs from the second and sixth MMSFFs 10 are input to the third XOR gate, and outputs from the fourth and eighth MMSFFs 10 are input to the fourth XOR gate. Outputs from the eighth MMSFF 10 and an output from the fourth XOR gate are input to the MUX 31a.

Outputs from the first XOR gate and the second XOR gate are input to one XOR gate in a second stage, and outputs from the third XOR gate and the fourth XOR gate are input to the other XOR gate in the second stage. An output from the other XOR gate in the second stage and an output from the MUX 31a are input to the MUX 31b. The outputs from the two XOR gates in the second stage are input to the XOR gate in a third stage. An output from the other XOR gate in the third stage and an output from the MUX 31b are input to the MUX 31c.

The compression ratio control signal from the multimode control circuit 20 is input to each MUX 31. The MUXs 31 are controlled by the compression ratio control signal in such a way that the compression ratio of the scan chain will be the same as that of the variable compressor 30A. Accordingly, the number of the MMSFFs 10 that are observed at the same time is limited to the number of scan chains. An output from the MMSFF 10 in the last stage of the scan chain that has been set by the compression control signal is compressed by the variable compressor 30A.

In the first embodiment, when an uncertain value (X) is captured in one of the MMSFFs 10, the uncertain value propagates through an output of the compressor 30, thus disabling the observation of all the MMSFFs 10 at the same time. There may be a problem that this propagation of the uncertain value reduces the failure detection rate or increases the number of test patterns, and thus the test time is increased.

On the other hand, in the second embodiment, the compression ratio of the variable compressor 30A can be changed in correspondence to the number of scan chains according to the switching of the configurations of the scan chains. By changing the path from the MMSFF 10 in the last stage of the scan chain that has been set to the external scan-out terminal in the variable compressor 30A by the compression ratio control signal, it is possible to prevent a reduction in the failure detection rate and an increase in the number of the test patterns due to the influence of the uncertain value.

Third Embodiment

Figure 6:
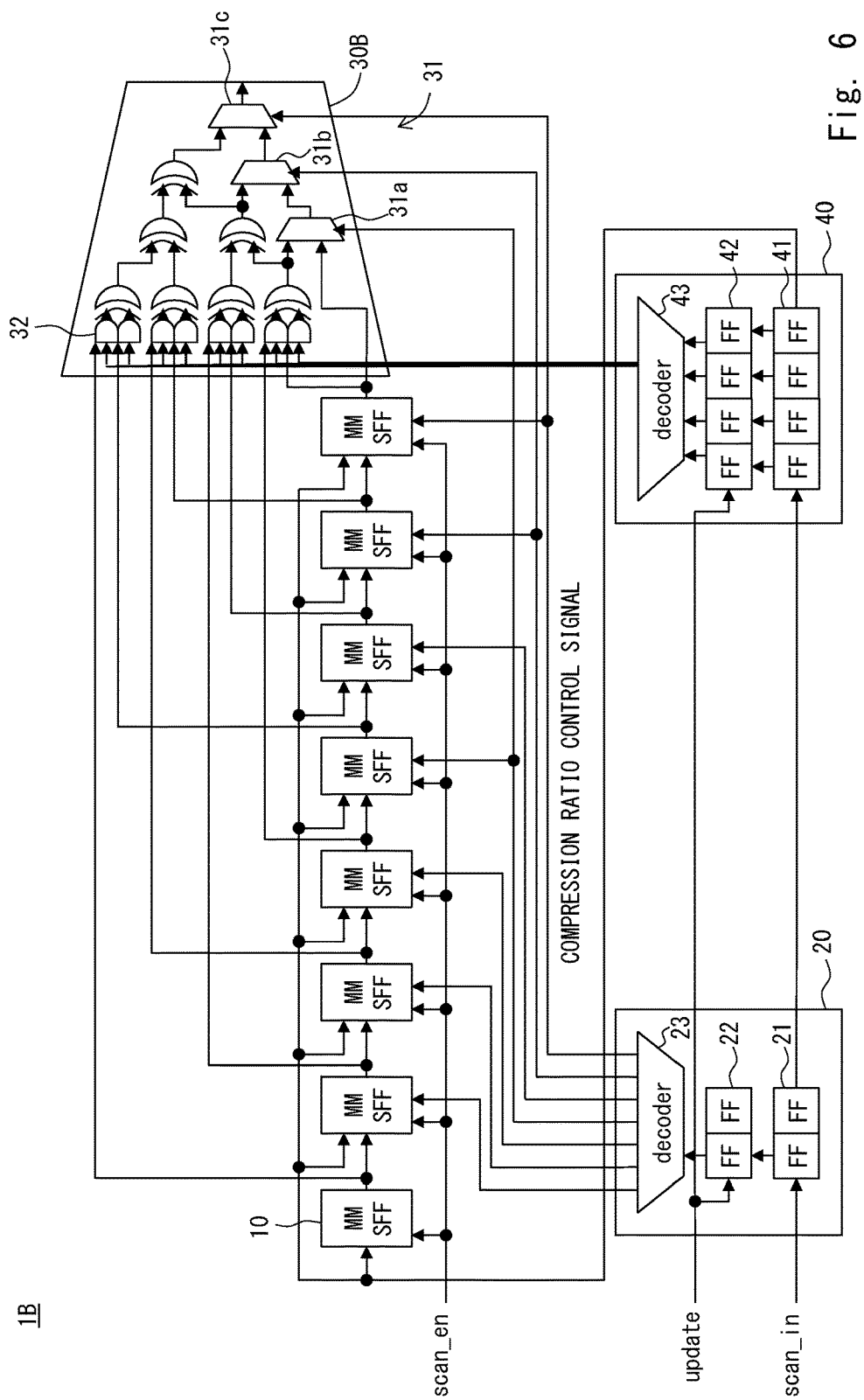
FIG. 6 is a drawing showing a configuration of a semiconductor apparatus according to a third embodiment.

A semiconductor apparatus according to a third embodiment shall be explained as follows with reference to FIG. 6. FIG. 6 is a drawing showing a configuration of a semiconductor apparatus 1B according to the third embodiment. As shown in FIG. 6, the semiconductor apparatus 1B includes a plurality of the MMSFFs 10, the multimode control circuit 20, a compression ratio variable compressor 30B, and a mask control circuit 40. Differences between the second embodiment and the third embodiment is that in the third embodiment, the variable compressor 30B is included in place of the variable compressor 30A that is included in the second embodiment, and the mask control circuit 40 for controlling the variable compressor 30B is included.

In a manner similar to the variable compressor 30A, the variable compressor 30B includes the MUXs 31 (31$a$ to 31$c$). Further, mask circuits 32 are provided respectively to input sides of four XOR gates in a first stage. More specifically, the mask circuits 32 are provided between a plurality of scan chains and the compressor. The mask circuits 32 block an input of a part of results of particular logical calculations in outputs from the plurality of scan chains to the compressor.

The mask control circuit 40 controls the mask circuits 32 so that they are enabled or disabled according to the result of the logical calculation which is blocked. The mask control circuit 40 includes a shift register 41, a hold register 42, and a decoder 43. The shift register 41 is connected in series to the shift register 21 of the multimode control circuit 20. In the third embodiment, the shift register 21, the shift register 41, and the MMSFFs 10 are connected in series. Accordingly, in the third embodiment, the scan-in signal includes the external input test signal, the compression ratio control signal, and the mask control signal. Note that it is not necessary to connect the multimode control circuit 20, the mask control circuit 40, and the scan chains in parallel, and the control may be performed externally and independently by a separate input terminal.

When the mask control signal is transferred within the shift register 41, a value of the mask control signal is set in each shift register. The mask control signal is set in the shift register 41 during the scan shift period. The mask control signal that has been set in the shift register 41 is captured in the hold register 42 by the update signal. The setting value of the hold register 42 is decoded by the decoder 43 and supplied to the mask circuits 32. The mask circuits 32 block an input of a part of the results of the logical calculations that are input from the scan chains according to the mask control signal.

The mask circuits 32 can, for example, prevent an uncertain value that is input from the scan chains from propagating. The mask circuits 32 mask the scan chain that includes the MMSFF 10 which has captured the uncertain value in the capture operation in a predetermined test pattern. This prevents a reduction in a failure detection rate and an increase in the number of test patterns due to an influence of the uncertain value.

Further, in order to observe a failure in the scan chain which is masked in a predetermined test pattern, it is possible to perform a control not to mask the corresponding scan chain in another test pattern. This enables an observation of a failure in the MMSFFs 10 other than the MMSFF 10 which captures the uncertain value in the corresponding scan chain.

Figure 7:
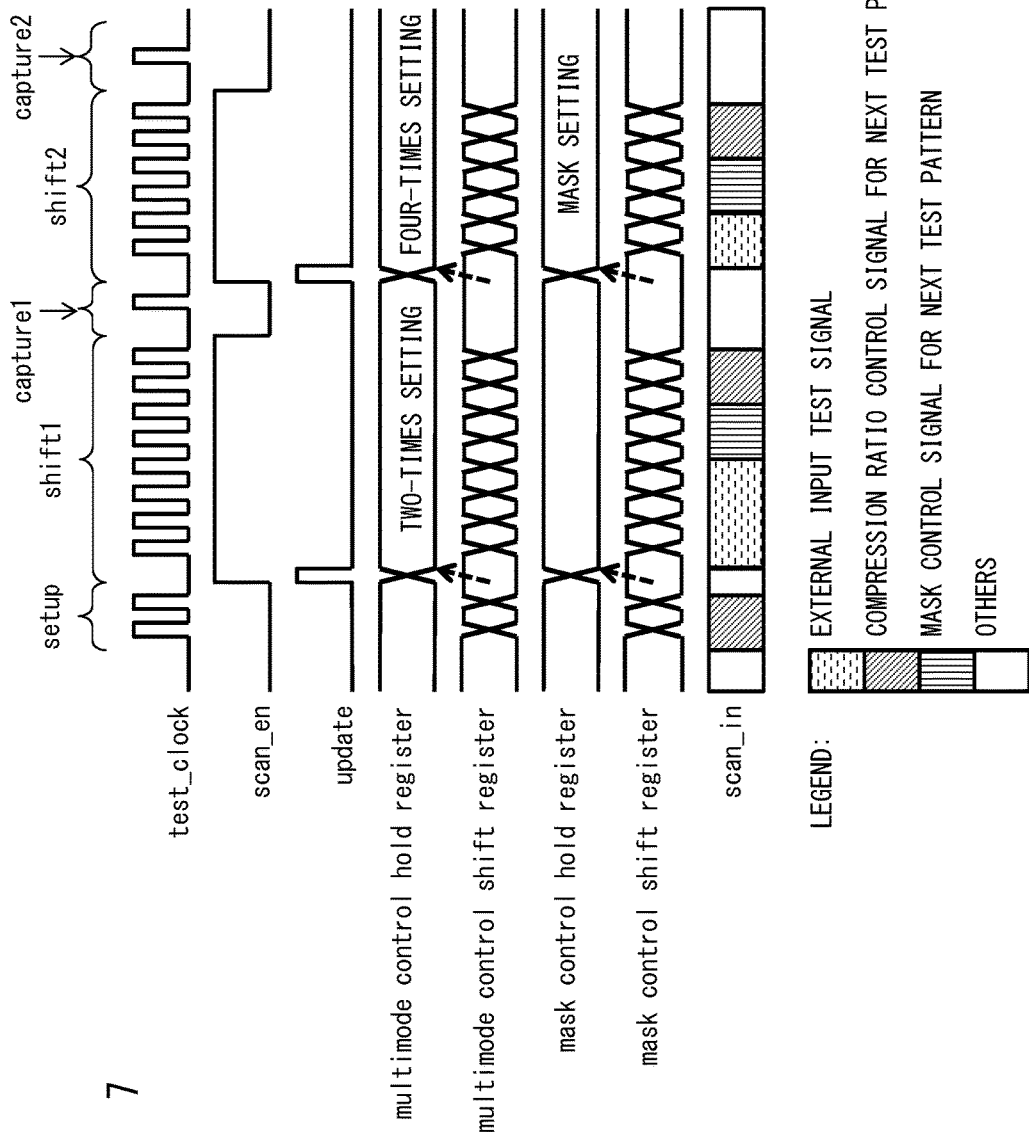
FIG. 7 is a drawing for explaining an operation of the semiconductor apparatus according to the third embodiment.

An operation of the semiconductor apparatus 1B shall be explained as follows with reference to FIG. 7. FIG. 7 is a drawing for explaining the operation of the semiconductor apparatus 1B according to the third embodiment. An output signal from the hold register 42 is referred to as a "mask control hold register", and an output signal from the shift register 21 is referred to as a "mask control shift register". As described above, in the third embodiment, the scan-in signal includes the external input test signal, the compression ratio control signal, and the mask control signal. Note that other signals are the same as those in FIG. 4.

In the third embodiment, after the external input test signal as the scan-in signal is input, the mask control signal for the next test pattern is input. After this, the compression ratio control signal for the next test pattern is input. Firstly, in a setup period, the compression ratio control signal for a test pattern which will be input in a scan shift period shift1 following the setup period is input. In the scan shift period shift1, a mode in which two scan chains are established is set.

Next, at a rising edge of the scan-enable signal, the scan shift operation is performed in the mode in which two scan chains are established. The scan-in signal that is input in the scan shift period shift1 includes the external input test signal corresponding to the test pattern which is set in each MMSFF 10 in the scan shift period shift1, the mask control signal for the test pattern which will be set in the MMSFFs 10 in the next scan shift period shift2, and the compression ratio control signal.

The external input test signal is expanded by the expander and deployed to each scan chain, and a value is set in each MMSFF 10 by the scan shift operation. After the external input test signal is input, the mask control signal for the next test pattern is input. The mask control signal is transferred within the shift register 41, and a value of the mask control signal is set in each shift register. After this, the compression ratio control signal for the next test pattern is input.

In the example shown in FIG. 7, the multimode setting for the test pattern in the next scan shift period shift2 is a four-time setting. In the scan shift period shift1, the compression ratio control signal for establishing four scan chains is set in the shift register 21. Then, at a falling edge of the scan enable signal, the capture operation is performed. Further, the compression ratio control signal is supplied to the MUXs 31$a$ to 31$c$. The compression ratio of the variable compressor 30B is controlled to be the same as that of the scan chain.

Then, in response to the update signal, the mask control signal that has been set in the hold register 42 is captured in the hold register 42. Further, the compression ratio control signal that has been set in the shift register 21 is captured in the hold register 22 in response to the update signal. These mask control and compression ratio control signals are held during the scan shift period shift2.

In the scan shift period shift2, a mode in which four scan chains are established is set. Moreover, the mask circuits 32 are controlled according to the mask control signal, and an arbitrary result of a logical calculation is blocked from entering the compressor. After this, in a manner similar to that of the above case, the mask control signal and the compression ratio control signal for the test pattern which will be set in the next scan shift period are set.

In the second embodiment, in an observation cycle of the MMSFF 10 which has captured the uncertain value, all the MMSFFs 10 in the same stage as the stage in which the MMSFF 10 which has captured the uncertain value in another scan chain exists cannot be observed. On the other hand, in the third embodiment, it is possible to block an uncertain value from propagating in each scan chain. This enables the observation of the MMSFF 10 on which an observation could not be performed due to the influence of the uncertain value, thereby preventing a reduction in the failure detection rate.

Note that in the third embodiment, although the variable compressor 30B includes the MUXs 31 and the mask circuits 32 for changing the compression ratio, the variable compressor 30B may have a configuration in which the MUXs 31 are not be included, and only the mask circuits 32 are be included.

Fourth Embodiment

Figure 8:
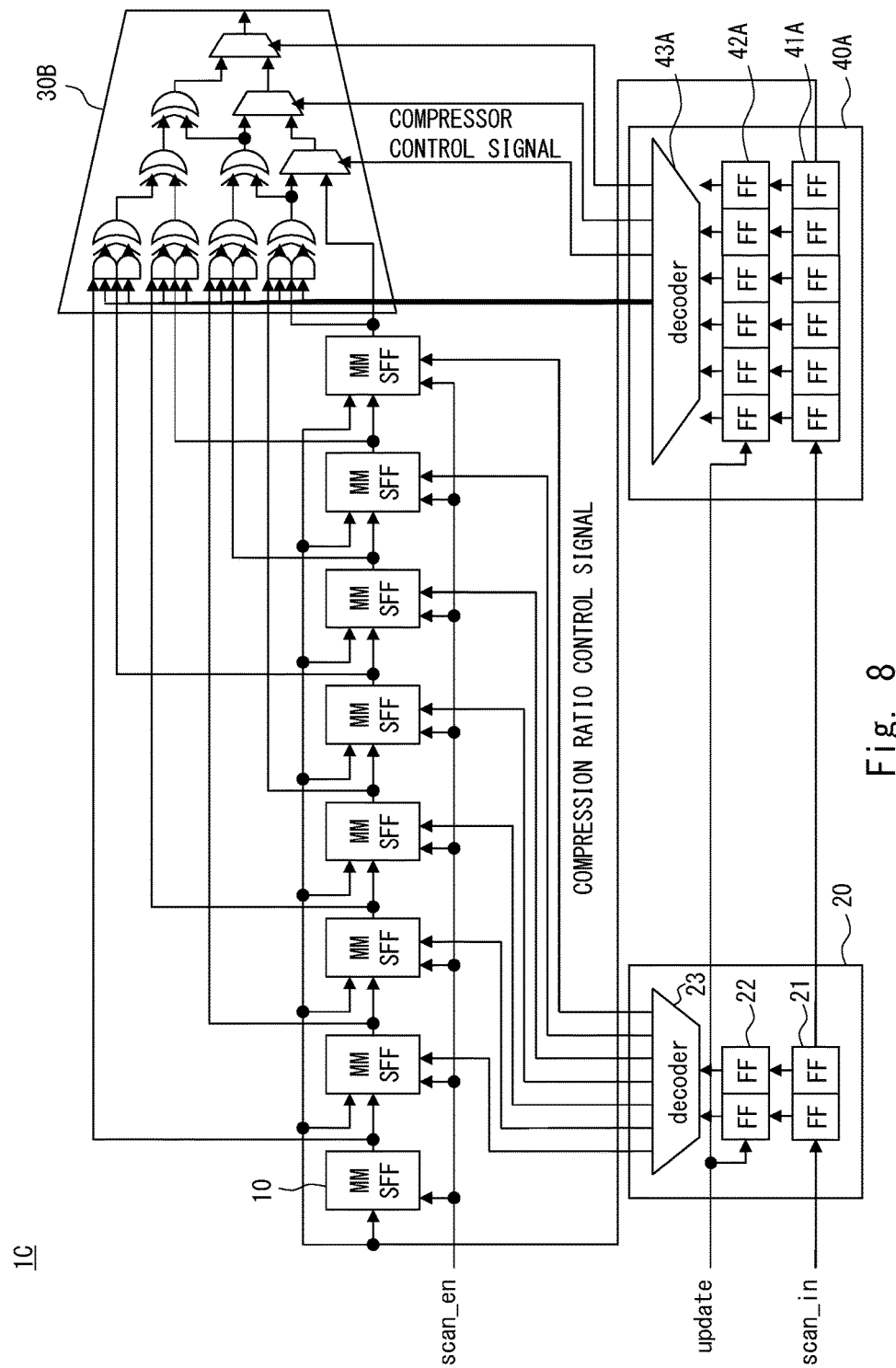
FIG. 8 is a drawing showing a configuration of a semiconductor apparatus according to a fourth embodiment.

A semiconductor apparatus according to a fourth embodiment shall be explained as follows with reference to FIG. 8. FIG. 8 is a drawing showing a configuration of a semiconductor apparatus 1C according to the fourth embodiment. As shown in FIG. 8, the semiconductor apparatus 1C includes a plurality of the MMSFFs 10, the multimode control circuit 20, the compression ratio variable compressor 30B, and a mask control circuit 40A. The semiconductor apparatus according to the fourth embodiment has a structure which enables an independent control on a compression ratio of an expander and a compression ratio of the variable compressor.

In the third embodiment, the variable compressor 30B is controlled by the compression ratio control signal output from the multimode control circuit 20, whereas in the fourth embodiment, the variable compressor 30B is controlled by a compressor control signal supplied from the mask control circuit 40A. The mask control circuit 40A includes a function to control a change in the compression ratio of the variable compressor 30B in addition to the function to control the mask circuits 32.

The mask control circuit 40A includes a shift register 41A, a hold register 42A, and a decoder 43A. The shift register 41A is connected in series to the shift register 21 of the multimode control circuit 20. In the third embodiment, the shift register 21, the shift register 41, and the MMSFFs 10 are connected in series.

A value of the compressor control signal for controlling the compression ratio of the variable compressor 30B together with the mask control signal are set in the shift register 41A separately from the compression ratio control signal which will be input to the MMSFFs 10. Accordingly, in the fourth embodiment, the scan-in signal includes the external input signal, the compression ratio control signal, the mask control signal, and the compressor control signal. The variable compressor 30B can be configured to have a compression ratio that is different from a compression ratio of a scan chain (the compression ratio of the expander).

In the second and third embodiments, the expander and the compressor have the same compression ratio, and thus the compression ratio for the previous test pattern and the compression ratio for the next test pattern are dependent on each other. As the dependency is created in the previous and next compression ratios, there is a limitation when values of a test pattern is set in each MMSFFs 10.

On the other hand, in the fourth embodiment, the compression ratios of the expander and the variable compressor 30B can be independently controlled. Therefore, the next test pattern can be set in each MMSFF 10 with no influence from the compression ratio for the previous test pattern.

By changing the compression ratio of the variable compressor 30B in consideration of, for example, a scan chain which is masked by the mask circuits 32, it is possible to prevent a reduction in a compression efficiency of the compressor 30. More specifically, the compression ratio of the variable compressor 30B can be changed and the mask circuits 32 can be controlled in a combination so as to prevent the reduction in the compression efficiency of the compressor 30.

Additionally, when the scan chain in which an uncertain value exists is masked, the compression ratio of the variable compressor 30B and the control on the mask circuits 32 can be selected in such a way to prevent the mask circuits 32 from reducing the compression efficiency by the mask circuits 32. When, for example, only one scan chain is masked, the number of the MMSFFs 10 which will be masked will be small in a high-compressed scan configuration. By setting different compression ratios in the expander and compressor, it is possible to prevent the mask processing by the mask circuit 32 from reducing the compression efficiency, and thus the number of test patterns can be reduced.

Fifth Embodiment

Figure 9:
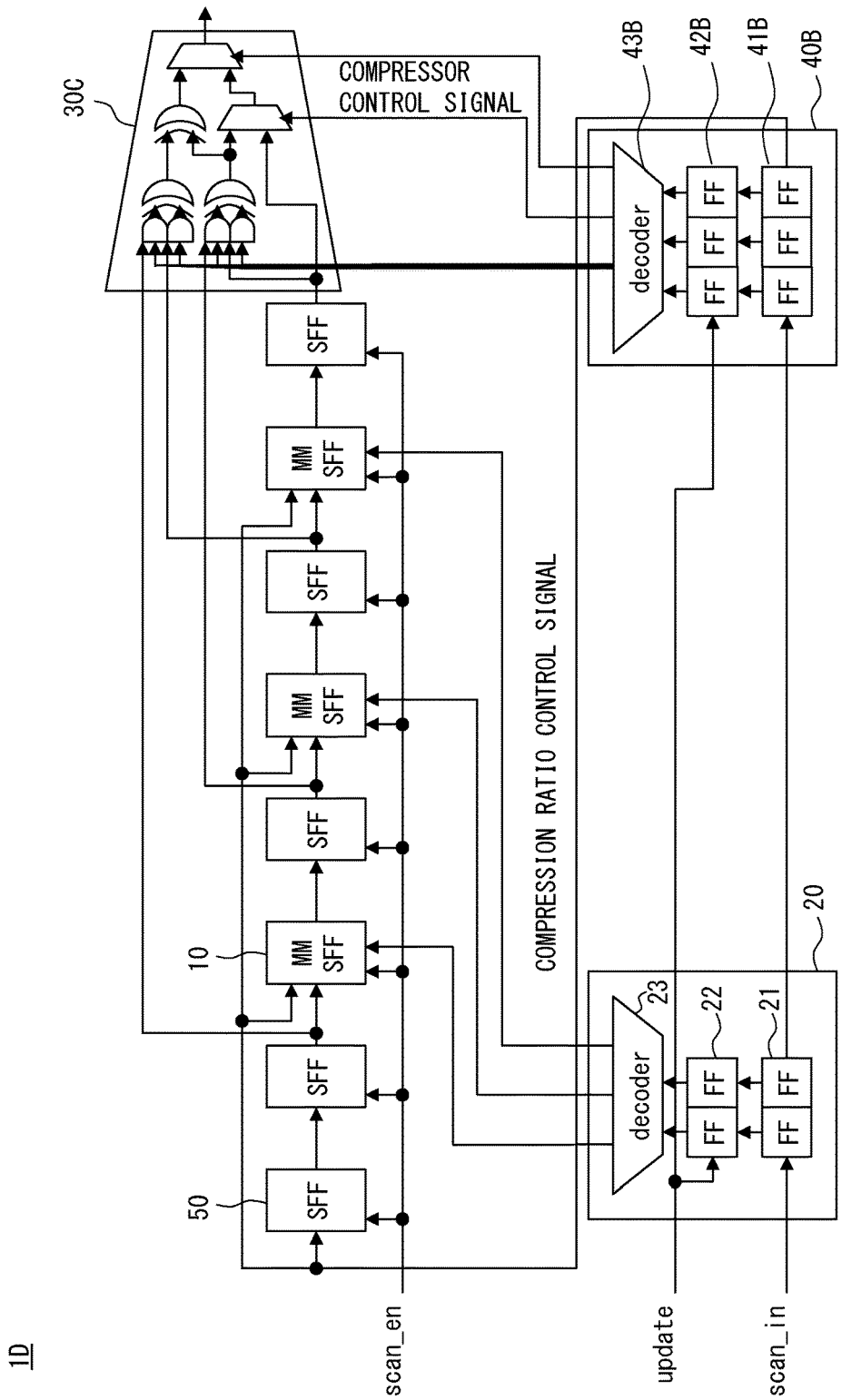
FIG. 9 is a drawing showing a configuration of a semiconductor apparatus according to a fifth embodiment.

A semiconductor apparatus according to a fifth embodiment shall be explained as follows with reference to FIG. 9. FIG. 9 is a drawing showing a configuration of a semiconductor apparatus 1D according to the fifth embodiment. As shown in FIG. 9, the semiconductor apparatus 1D includes a plurality of the MMSFFs 10, a plurality of SFFs (scan flip-flops) 50, the multimode control circuit 20, a compression ratio variable compressor 30C, and a mask control circuit 40B. In terms of reducing the number of test steps, too detailed multimode control may become unnecessary. In the fifth embodiment, the scan chain includes the MMSFFs 10 and the SFFs 50 and reduces a maximum compression ratio more than it is reduced in the fourth embodiment.

The SFF 50 is a scan flip-flop for shifting which is capable of switching between the scan shift operation and the capture operation and outputs the external input test signal or the shift test signal which is input as it is in the scan shift operation. As shown in FIG. 9, in the semiconductor apparatus 1D, the SFFs 50 are arranged as the first, second, fourth, sixth, and eighth flip-flops, and the MMSFFs 10 are arranged as the third, fifth, and seventh flip-flops.

The first SFF 50 outputs the external input test signal which is externally input to the SFF 50 in the subsequent stage as it is. The second SFF 50 outputs the shift test signal that is input from the first SFF 50 to the third MMSFF 10. The third MMSFF 10 outputs one of the external input test signal and the shift test signal according to the compression ratio control signal.

In comparison to the case in which all the flip-flops are the MMSFFs 10 as in the semiconductor apparatus 1C of the fourth embodiment, in the semiconductor apparatus 1D of the fifth embodiment, the maximum compression ratio will become 1/2 thereof. More specifically, in the circuit configuration shown in FIG. 8, the maximum compression ratio is eight times, whereas in the circuit configuration shown in FIG. 9, the maximum compression ratio is four times. Some of the MMSFFs 10 can be replaced by the SFFs 50 to correspond to an arbitrary maximum compression ratio. In order to have the maximum compression ratio of 1/N times when all the flip-flops are the MMSFFs 10, one MMSFF 10 is arranged at every N flip-flop in a scan chain configuration having a minimum compression ratio.

According to the fifth embodiment, it is possible to reduce an area to become smaller than an area when all the flips are the MMSFFs 10. When the maximum compression ratio is, for example, 1/10, the flip-flops which will be replaced by the MMSFFs 10 in the scan chain will become 1/10. When a ratio of an area of a logical part in a chip of the MMSFFs 10 and SFF 50 to a whole area of the chip is about 10 %, and the maximum compression ratio is 1/10, an influence on the area of the logical part in the chip is about 0.1%. Note that as only the external input test signal is input to the first SFF 50, the first flip-flop can be fixed to the SFF 50. This SFF 50 is connected to the expander. This further prevents an increase in the area of the semiconductor apparatus.

Sixth Embodiment

Figure 10:
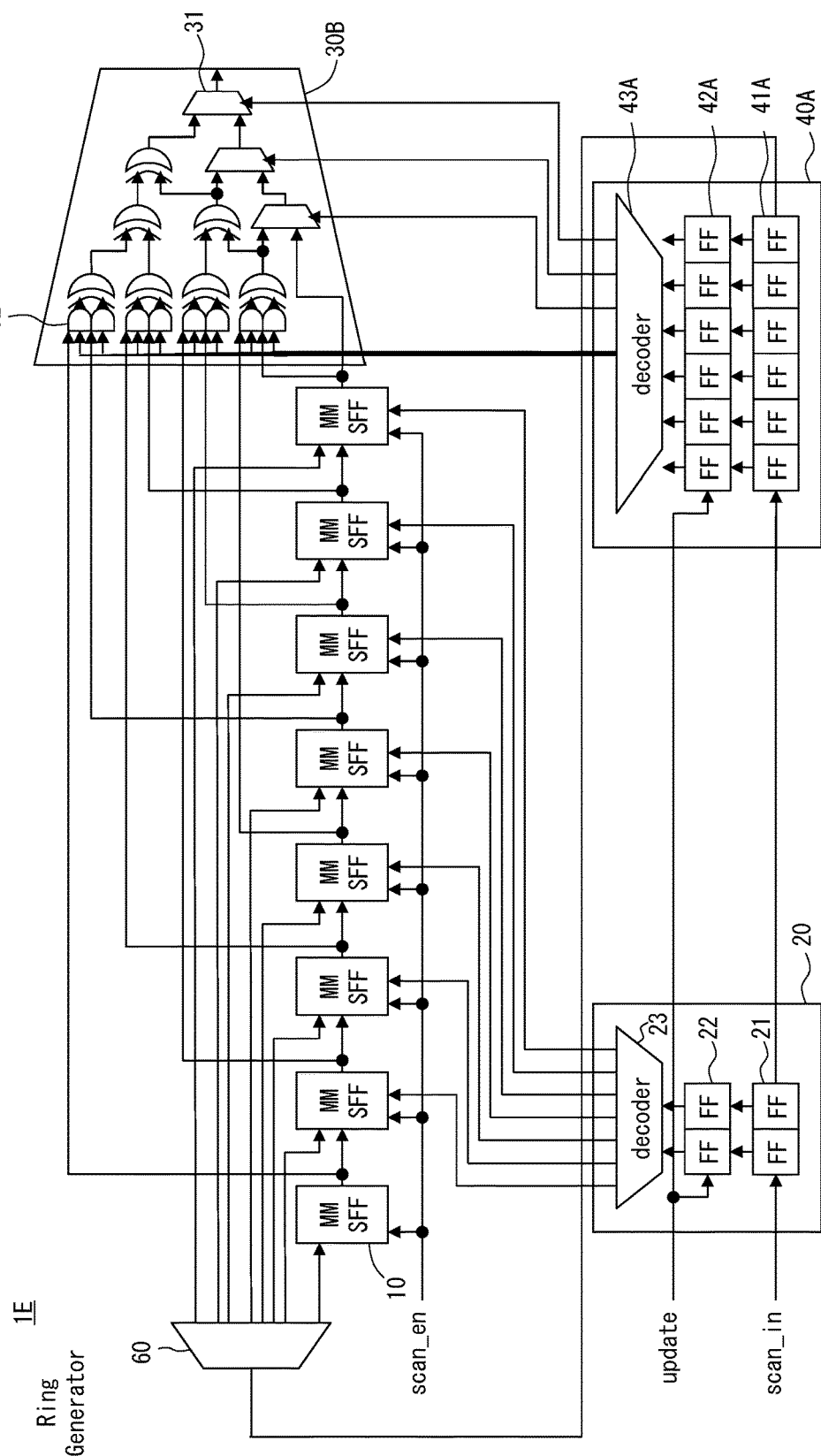
FIG. 10 is a drawing showing a configuration of a semiconductor apparatus according to a sixth embodiment.

A semiconductor apparatus according to a sixth embodiment shall be explained as follows with reference to FIG. 10. FIG. 10 is a drawing showing a configuration of a semiconductor apparatus 1E according to the sixth embodiment. As shown in FIG. 10, the semiconductor apparatus 1E includes a plurality of the MMSFFs 10, the multimode control circuit 20, the compression ratio variable compressor 30B, and the mask control circuit 40A. The semiconductor apparatus 1E according to the sixth embodiment includes a ring generator 60 as an expander in place of an expander having a fan-out configuration.

The ring generator 60 is connected in series to the multimode control circuit 20 and the mask control circuit 40A. An externally input scan-in signal includes the external input test signal, the compressor control signal, the mask control signal, and the compression ratio control signal. The external input control signal passes through the shift register 21 of the multimode control circuit 20 and the shift register 41A of the mask control circuit 40A and is supplied to the ring generator 60. The external input test signal is expanded and deployed by the ring generator 60 according to the number of scan chains and supplied to the first MMSFF 10 of each scan chain.

Figure 11:
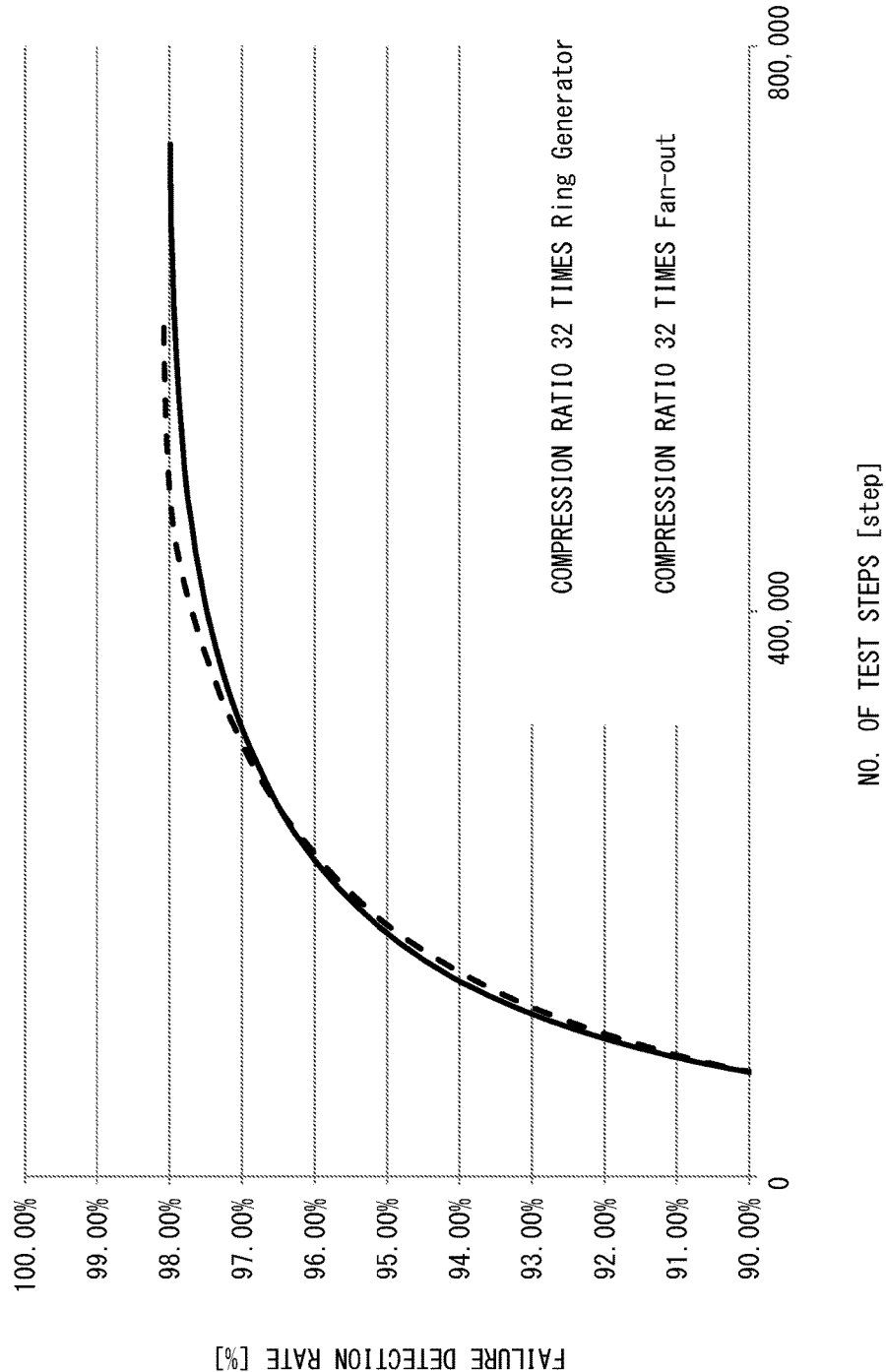
FIG. 11 is a graph showing a relationship between the number of test steps and a failure detection rate with different compression ratios in the semiconductor apparatus according to the sixth embodiment.

FIG. 11 shows a relationship between the number of test steps and a failure detection rate when an expander having a fan-out configuration is used and when a ring generator is used. As shown in FIG. 11, when the ring generator is used, the failure detection rate is high by a small number of test steps. When the ring generator is used as the expander, it is possible to reduce the number of test steps and improve the failure detection rate more than when the expander having the fan-out configuration is used. However, when the ring generator is used, an area of the chip will be larger than that when the expander having the fan-out configuration is used.

Seventh Embodiment

Figure 12:
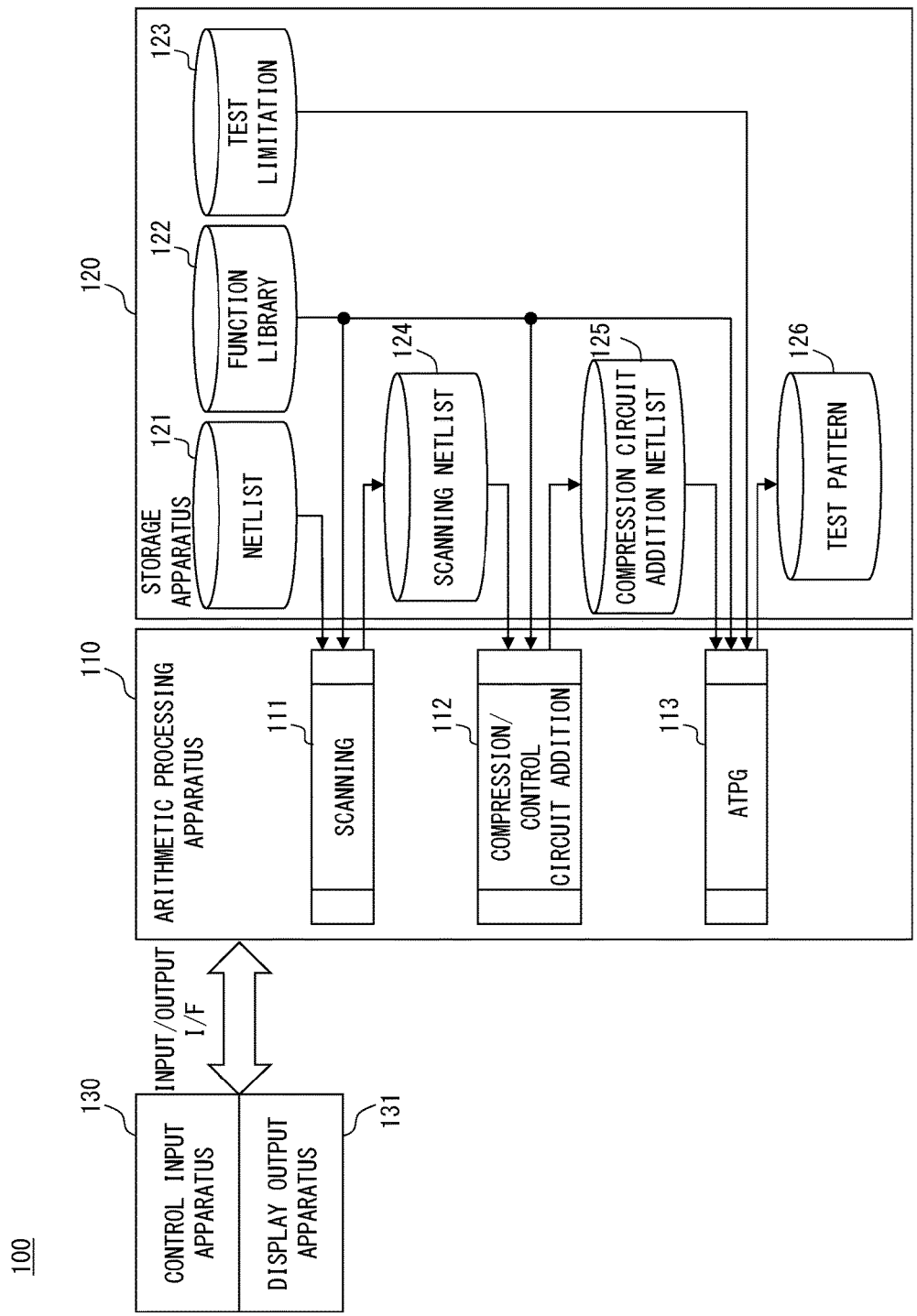
FIG. 12 is a drawing showing a design apparatus for a semiconductor apparatus according to a seventh embodiment.

A design apparatus 100 according to a seventh embodiment shall be explained as follows with reference to FIG. 12. The design apparatus 100 designs a semiconductor apparatus capable of performing a compression scan test while switching the number of scan chains and, using the semiconductor apparatus, generates a test pattern for performing the compression scan test while switching the number of scan chains for each test pattern.

The design apparatus 100 includes an arithmetic processing apparatus 110, a storage apparatus 120, a control input apparatus 130, and a display output apparatus 131. The arithmetic processing apparatus 110 can load a program necessary for designing a semiconductor apparatus and execute function processes necessary for the design and includes a CPU, memory and the like. The arithmetic processing apparatus 110 includes a scanning execution program 111, a compression/control circuit addition program 112, and an ATPG (Automatic Test Pattern Generation) program 113.

The storage apparatus 120 includes a netlist 121, a function library 122, a test limitation DB 123, a scanning netlist 124, a compression circuit addition netlist 125, and a test pattern DB 126. The storage apparatus 120 indicates a storage media such as an HDD disk and a memory for storing information on a library and a netlist. The design apparatus 100 uses the program of the arithmetic processing apparatus 110, refers to the netlist and the library in the storage apparatus 120, generates the semiconductor apparatus capable of performing the variable compression scan test which has been explained in the above embodiments, and generates a test pattern for performing the variable compression scan test.

The control input apparatus 130 is a collective term for apparatuses for a user to operate the arithmetic processing apparatus 110 and the storage apparatus 120 and is, for example, a keyboard, a mouse or the like. The display output apparatus 131 is for the user to check an operation of the arithmetic processing apparatus 110 and the storage apparatus 120 and is, for example, a display or the like.

The netlist 121 stores cell information on an AND gate, an OR gate, an EOR gate and the like, information on connection between terminals and the like. The function library stores functions of cells, a replacement list and the like. The replacement list includes, for example, information for replacing SFFs constituting a scan chain by MMSFFs. The arithmetic processing apparatus 110 executes the scanning program 111 to thereby refer to the netlist 121 and the function library 122 and generate a scanning netlist of the semiconductor apparatus capable of performing the variable compression scan test.

The scanning program 111 generates a semiconductor apparatus that has a function to build a general scan chain and is also capable of switching a plurality of scan chain configurations by a compression ratio control signal. In a logic necessary for switching the scan chain configurations, the SFFs 50 are inserted or SFFs are replaced by the MMSFFs 10. Further, as shown in FIG. 9, the scanning program 111 may include the SFFs 50 and the MMSFFs 10. In this case, the scanning program 111 may execute a process to connect the SFFs 50 to the expander.

Moreover, the arithmetic processing apparatus 110 executes the compression/control circuit addition program 112 to thereby refer to the scanning netlist 124 and the function library 122 and generate the compression circuit addition netlist 125. The compression/control circuit addition program 112 inserts the multimode control circuit 20, inserts an expander in which a compression ratio thereof can be changed, inserts a compressor in which a compression ratio thereof can be changed, connects the multimode control circuit 20 to a scan chain switching logic, connects the expander to a scan chain, and connects the compressor to the scan chain. Furthermore, in a manner similar to the second embodiment, the compression/control circuit addition program 112 may change the compression ratio of the variable compressor 30A according to the number of scan chains.

Additionally, the arithmetic processing apparatus 110 executes the ATPG program 113 to thereby refer to the compression circuit addition netlist 125, the function library 122, and the test limitation DB 123 and generate a test pattern. The test limitation DB 123 stores information necessary for operating a circuit at the time of a test. The information stored in the test limitation DB 123 includes, for example, information for fixing an external output terminal to zero.

The ATPG program 113 has a function that generates a test pattern in such a way that the number of test steps will become minimal by switching the scan chain configurations for each test pattern in consideration of switchable scan chain configurations. The generated test pattern is stored in the test pattern DB 126. In the semiconductor apparatus, a variable compression scan test is executed using the test pattern stored in the test pattern DB 126.

Figure 13:
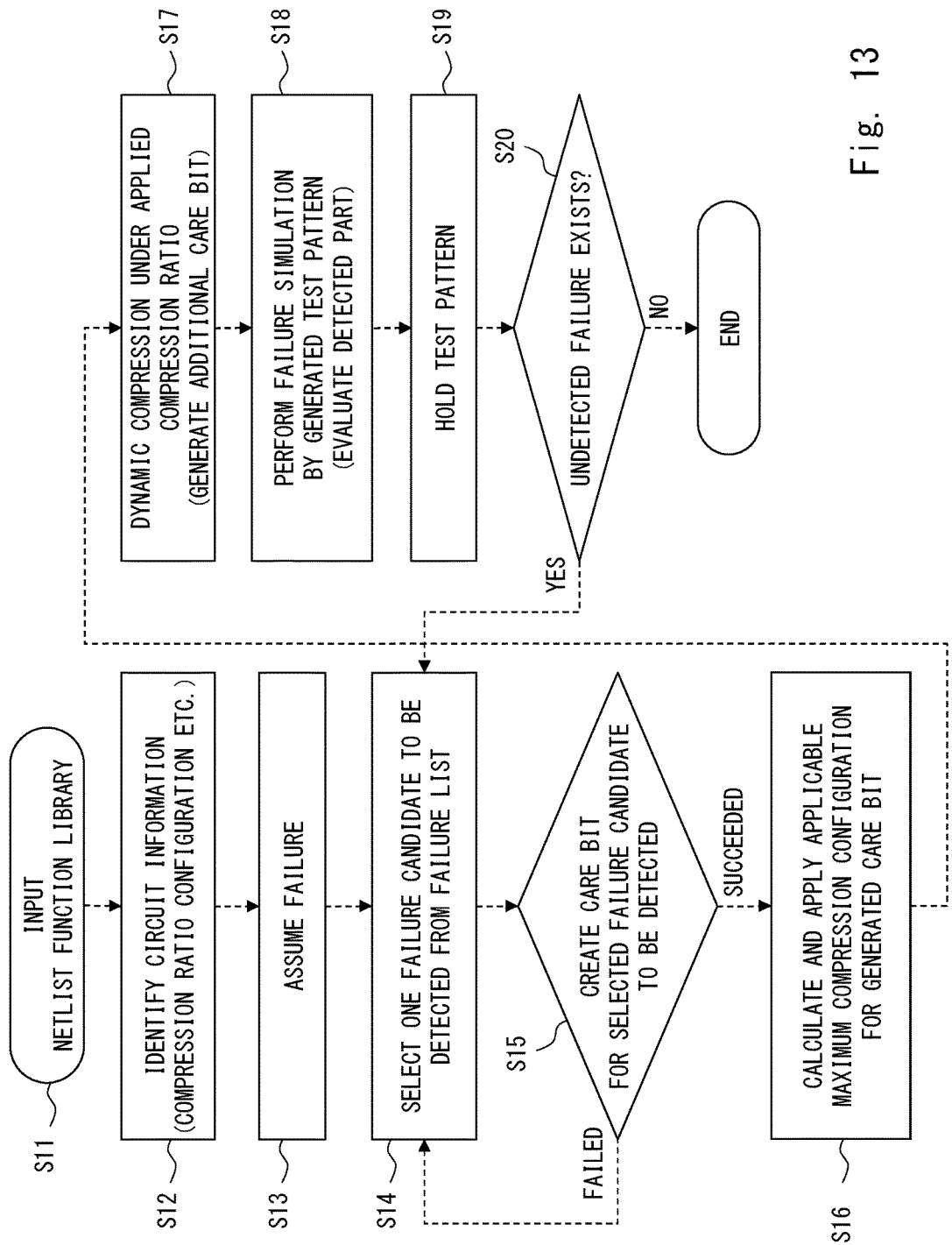
FIG. 13 is a drawing showing an example of a design flow of the semiconductor apparatus according to the seventh embodiment.

A design flow of a semiconductor apparatus shall be explained as follows with reference to FIG. 13. FIG. 13 is a drawing showing an example of the design flow of the semiconductor apparatus according to the seventh embodiment. As shown in FIG. 13, firstly the netlist 121 and the function library 122 are input (step S11). After this, a circuit is analyzed, and circuit information on switchable scan chain configurations (the compression ratio configuration etc.) which has been held in the circuit is identified (step S12).

Then, a failure is assumed in the identified circuit (step S13). Next, a failure candidate to be detected is selected from a failure list that has been input in advance (step S14), and a care bit calculation process for calculating a care bit corresponding to the failure candidate to be detected is executed (step S15). When the generation of the care bit has failed, the failure is identified as being a non-detected failure and excluded from the failure list. Then, another failure candidate to be detected is selected, and the above process is repeated until the generation of the care bit succeeds.

When the generation of the care bit that can detect the candidate failure to be detected has succeeded, a maximum compression ratio configuration that can justify the care bit is calculated and assumed (step S16). A switching process for performing a control on a selection of either the external input test signal or the shift test signal and switching the configurations of the scan chain is executed. Next, the care bit is added under a compression ratio limitation condition, so that the number of failures that can be detected at the same time is increased (dynamical compression) (step S17).

After this, a failure simulation for the generated test pattern is performed (step S18), a detectable range is identified, and the failure is excluded from the failure list. Then, the generated test pattern is stored in a memory or output to a disk. When the failure candidate to be detected remains in the failure list, the process from the generation of the care bit to the storage of the test pattern is repeated (step S19). All failures included in the failure list is identified as being detected or non-detected, and when there is no undetected failure which has not become a failure candidate to be detected in the failure list, the ATPG program 113 is ended (step S20).

FIG. 17 is a design flow in a compression scan according to the comparative example. As shown in FIG. 17, in the compression scan test design in which the compression ratio cannot be changed, firstly a circuit is analyzed for the input netlist and function library (steps S101 and 102), and a failure is assumed (step S103). Next, one care bit candidate failure to be detected is selected from assumed failures, and an attempt is made to generate the care bit that can detect the failure under a circuit limitation or the compression ratio limitation (step S104). When the generation of the care bit has failed due to the circuit limitation or the compression ratio limitation, the failure is excluded from the failure list. Then, another failure candidate to be detected is selected, and the above process is repeated until the generation of the care bit succeeds (step S105).

When the generation of the care bit that can detect the target failure has succeeded, the care bit is added, and at the same time, the number of detectable failures is increased (step S106). When the dynamical compression is completed, a failure simulation is performed, and a detectable range is identified by the generated test pattern (S107). Then, the generated test pattern is stored in a memory or output to a disk (S108). When an undetected failure which has not become the candidate failure to be detected remains in the failure list, the process from the generation of the care bit to the storage of the test pattern is repeated again (step S109). All failures included in the failure list is identified as being detected or non-detected, and when there is no undetected failure, the ATPG program 113 is ended. As described so far, in the comparative example, as the compression ratio cannot be changed, it is difficult to generate a test pattern with a high failure detection rate by a small number of test steps.

On the other hand, when the design apparatus according to the seventh embodiment is used, a semiconductor apparatus capable of switching the number of scan chains can be designed. Further, it is possible to generate a test pattern capable of executing a compression scan test while controlling this semiconductor apparatus to switch the number of scan chains for each test pattern. This enables a compression scan test that achieves a high failure detection rate by a small number of test steps.

Figure 14:
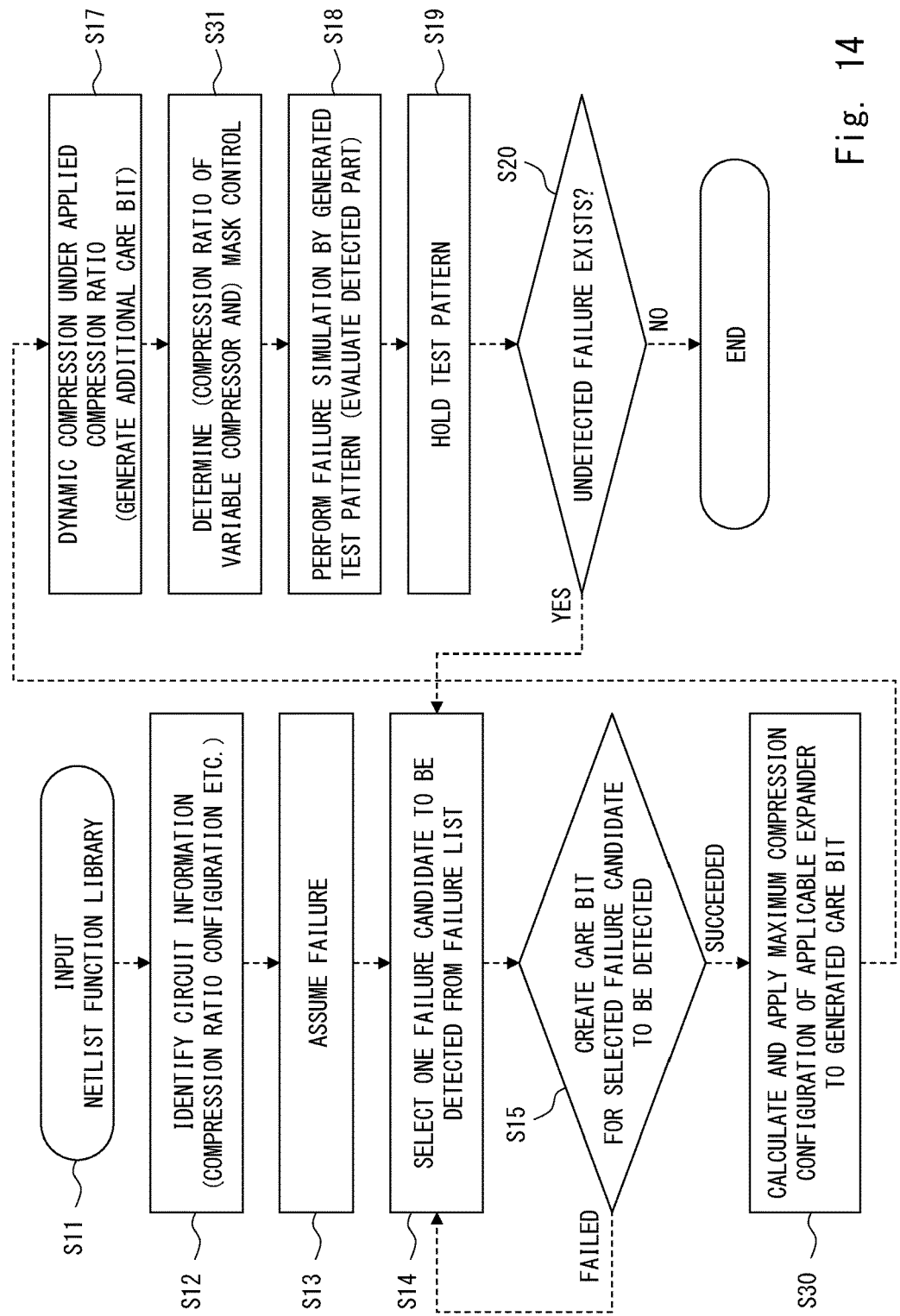
FIG. 14 is a drawing showing another example of the design flow of the semiconductor apparatus according to the seventh embodiment.

Note that the compression/control circuit addition program 112 may execute a process for further inserting mask circuits between a plurality of scan chains and a compressor, in which the mask circuits block an input of a part of particular test results in outputs from the plurality of scan chains to the compressor. FIG. 14 shows a design flow of a semiconductor apparatus when the compressor having the mask circuit 32 is used. In such a circuit configuration, after the care bit is generated, a maximum compression configuration of an expander that can be applied to the generated care bit is calculated and applied (step S30), the care bit is added (the dynamical compression), and then a necessary mask control can be determined (step S31). Note that together with the mask control, the compression ratio of the variable compressor may be calculated and applied.

Further, in the above embodiments, as only the external input test signal is input in the first SFF 50, the first flop-flop may be fixed to the SFF 50.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

While the invention has been described in terms of several embodiments, those skilled in the art will recognize that the invention can be practiced with various modifications within the spirit and scope of the appended claims and the invention is not limited to the examples described above.

The above embodiments can be combined as desirable by one of ordinary skill in the art.

Further, the scope of the claims is not limited by the embodiments described above.

Furthermore, it is noted that, Applicant's intent is to encompass equivalents of all claim elements, even if amended later during prosecution.

What is claimed is:
1. A semiconductor apparatus, comprising:
one or more scan chains including one or more scan flip-flops serially connected:
a combinational circuit;
a control circuit; and
a compressor;
wherein a scan flip-flop of the scan flip-flops is configured to selectively switch between a scan shift operation for causing the scan flip-flops in a scan chain of the scan chains to operate as a shift register and a capture operation for capturing an output from the combinational circuit, wherein the scan flip-flop comprises:
- a selection unit configured to select one of an external input test signal and a shift test signal in the scan shift operation, the external input test signal being externally input and the shift test signal being input via the scan flip-flop in a preceding stage of a same scan chain; and
- a flip-flop configured to output one of the external input test signal and the shift test signal which has been selected by the selection unit, wherein the selection unit selectively switches between the scan shift operation and the capture operation according to a scan enable signal that is input to the selection unit based on outputs from the scan chains, wherein the compressor is configured to be connected to output sides of the scan chains to compress and to convert the outputs from the scan chains, and wherein the control circuit provides a control signal to the selection unit for selecting one of the external input test signal and the shift test signal, and further provides another control signal to the compressor for changing a compression ratio according to a number of the scan chains.

2. The semiconductor apparatus according to claim 1, further comprising a mask circuit configured to be provided between the scan chains and the compressor to block an input of a part of particular test results in the outputs from the scan chains to the compressor.

3. The semiconductor apparatus according to claim 1, wherein the scan chain includes a scan flip-flop for shifting configured to be capable of switching between the scan shift operation and the capture operation, and
wherein the scan flip-flop for shifting outputs one of the external input test signal and the shift test signal which has been input as is in the scan shift operation.

4. The semiconductor apparatus according to claim 3, further comprising an expander configured to be connected to input sides of the scan chains to expand and to convert the external input test signal according to a number of scan chains,
wherein the scan flip-flop for shifting is connected to the expander.

5. The semiconductor apparatus according to claim 1, further comprising an expander configured to be connected to input sides of the scan chains to expand and to convert the external input test signal according to a number of the scan chains.

6. The semiconductor apparatus according to claim 1, wherein the control circuit provides said another control signal to the compressor independent of the control signal that is provided to the selection unit.

7. The semiconductor apparatus according to claim 1, wherein the control circuit directly provides said another control signal to the compressor.

* * * * *